United States Patent
Kim et al.

(10) Patent No.: US 11,985,846 B2
(45) Date of Patent: May 14, 2024

(54) DISPLAY DEVICE INCLUDING STACKED CAPPING LAYERS

(71) Applicant: Samsung Display Co., Ltd., Yongin-si (KR)

(72) Inventors: Dal Ho Kim, Seongnam-si (KR); Hee Seong Jeong, Suwon-si (KR); Won Ju Kwon, Hwaseong-si (KR); Sun Hwa Kim, Hwaseong-si (KR); Hyang Ki Sung, Hwaseong-si (KR); Na Ri Heo, Hwaseong-si (KR); Sang Min Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 320 days.

(21) Appl. No.: 17/226,554

(22) Filed: Apr. 9, 2021

(65) Prior Publication Data
US 2021/0359274 A1 Nov. 18, 2021

(30) Foreign Application Priority Data

May 13, 2020 (KR) .................. 10-2020-0057017
Dec. 30, 2020 (KR) .................. 10-2020-0188554

(51) Int. Cl.
*H10K 50/81* (2023.01)
*H10K 50/84* (2023.01)
(Continued)

(52) U.S. Cl.
CPC ......... *H10K 50/858* (2023.02); *H10K 50/844* (2023.02); *G09G 2300/0408* (2013.01);
(Continued)

(58) Field of Classification Search
CPC .. H10K 50/858; H10K 50/844; H10K 50/816; H10K 50/818; H10K 50/8445;
(Continued)

(56) References Cited

U.S. PATENT DOCUMENTS

2015/0123086 A1* 5/2015 Lee ............... H10K 50/858
  438/26
2016/0149157 A1* 5/2016 Cho ............... H10K 85/654
  257/40

(Continued)

FOREIGN PATENT DOCUMENTS

JP WO2011/055440 A1 5/2011
KR 10-2014-0033867 A 3/2014
(Continued)

OTHER PUBLICATIONS

European Notification of the Office Action issued in corresponding Patent Application No. EP 21173683.0, dated Nov. 3, 2023, 10 pages.
(Continued)

*Primary Examiner* — Ida M Soward
(74) *Attorney, Agent, or Firm* — Lewis Roca Rothgerber Christie LLP

(57) ABSTRACT

A display device includes: a substrate; a display element on the substrate; a capping layer on the display element; and a thin film encapsulation layer on the capping layer, wherein the capping layer includes: a first capping layer on the display element; a second capping layer on the first capping layer, the second capping layer having a refractive index greater than that of the first capping layer; and a third capping layer on the second capping layer, the third capping layer having a refractive index smaller than that of the second capping layer, wherein the second capping layer has a thickness of 30 nanometers (nm) to 60 nm.

26 Claims, 16 Drawing Sheets

(51) Int. Cl.
*H10K 50/844* (2023.01)
*H10K 50/85* (2023.01)
*H10K 50/858* (2023.01)
*H10K 59/12* (2023.01)
*H10K 59/80* (2023.01)
*H10K 50/816* (2023.01)
*H10K 50/818* (2023.01)
*H10K 59/121* (2023.01)
*H10K 59/122* (2023.01)
*H10K 59/131* (2023.01)
*H10K 77/10* (2023.01)
*H10K 102/00* (2023.01)

(52) U.S. Cl.
CPC ......... *H10K 50/816* (2023.02); *H10K 50/818* (2023.02); *H10K 50/8445* (2023.02); *H10K 59/12* (2023.02); *H10K 59/1216* (2023.02); *H10K 59/122* (2023.02); *H10K 59/131* (2023.02); *H10K 59/80516* (2023.02); *H10K 59/80517* (2023.02); *H10K 77/111* (2023.02); *H10K 2102/311* (2023.02); *H10K 2102/351* (2023.02)

(58) Field of Classification Search
CPC .. H10K 59/12; H10K 59/123; H10K 59/1213; H10K 59/126; H10K 59/131; H10K 59/1216; H10K 59/80516; H10K 59/80517; H10K 59/122; H10K 77/111; H10K 2102/351; H10K 2102/311; G09G 2300/0408
See application file for complete search history.

(56) References Cited

U.S. PATENT DOCUMENTS

| | | | | |
|---|---|---|---|---|
| 2016/0155979 | A1* | 6/2016 | Yim | H10K 50/858 257/40 |
| 2016/0197308 | A1* | 7/2016 | Jeong | H10K 50/852 257/40 |
| 2016/0300893 | A1* | 10/2016 | Yim | H10K 50/82 |
| 2016/0380231 | A1* | 12/2016 | Yim | H10K 50/828 257/40 |
| 2017/0125497 | A1* | 5/2017 | Kim | H10K 50/844 |
| 2018/0013100 | A1 | 1/2018 | Yim et al. | |
| 2018/0097045 | A1* | 4/2018 | Maeda | H10K 71/00 |
| 2018/0123068 | A1* | 5/2018 | Ushikubo | H10K 59/12 |
| 2018/0182823 | A1* | 6/2018 | Ito | H10K 50/84 |
| 2018/0190940 | A1 | 7/2018 | Liu et al. | |
| 2019/0123303 | A1* | 4/2019 | Yasukawa | H10K 50/844 |
| 2020/0168671 | A1* | 5/2020 | Jang | G06F 3/0412 |
| 2021/0210733 | A1 | 7/2021 | Yim et al. | |

FOREIGN PATENT DOCUMENTS

| | | |
|---|---|---|
| KR | 10-1502206 B1 | 3/2015 |
| KR | 10-2015-0052490 A | 5/2015 |
| KR | 10-1573752 B1 | 12/2015 |
| KR | 10-2016-0049157 A | 5/2016 |
| KR | 10-2017-0001827 A | 1/2017 |
| KR | 10-2018-0112925 A | 10/2018 |
| KR | 10-2067162 B1 | 1/2020 |

OTHER PUBLICATIONS

Thormahlen, I. et al., "Refractive Index of Water and Its Dependence on Wavelength, Temperature, and Density", Journal of Physical and Chemical Reference Data, 1985, pp. 933-945, vol. 14, No. 4.

* cited by examiner

DISPLAY DEVICE INCLUDING STACKED CAPPING LAYERS

CROSS-REFERENCE TO RELATED APPLICATION

This application claims priority to and the benefit of Korean Patent Application No. 10-2020-0057017 filed on May 13, 2020 and Korean Patent Application No. 10-2020-0188554 filed on Dec. 30, 2020 in the Korean Intellectual Property Office, and all the benefits accruing therefrom, the contents of which in its entirety are herein incorporated by reference.

BACKGROUND

1. Field

Aspects of some example embodiments of the present disclosure relate to a display device.

2. Description of the Related Art

In recent years, the various uses of display devices have become more diversified. In addition, because the thickness of display devices is relatively thin and the weight is relatively light, the range of uses for display devices has increased, and research on display devices that may be used in various fields is continuously being conducted.

The display elements provided in a display device emit light of a predetermined color to display images, and the emitted light may pass through a sealing member for sealing the display elements. In the case where the sealing member has a structure in which a plurality of layers are stacked, the light emitted from the display element may undergo interference due to the film thickness of the sealing member.

The above information disclosed in this Background section is only for enhancement of understanding of the background and therefore the information discussed in this Background section does not necessarily constitute prior art.

SUMMARY

Aspects of some example embodiments of the present disclosure include a display device capable of reducing the overall amount of movement in a color temperature direction by arranging a plurality of capping layers with a controlled refractive index and thickness between a display element and a sealing member.

However, aspects of embodiments according to the present disclosure are not restricted to the one set forth herein. The above and other aspects of embodiments according to the present disclosure will become more apparent to one of ordinary skill in the art to which the present disclosure pertains by referencing the detailed description of the present disclosure given below.

According to some example embodiments, a display device includes: a substrate; a display element on the substrate; a capping layer on the display element; and a thin film encapsulation layer on the capping layer, wherein the capping layer includes: a first capping layer on the display element; a second capping layer on the first capping layer, the second capping layer having a refractive index greater than that of the first capping layer; and a third capping layer on the second capping layer, the third capping layer having a refractive index smaller than that of the second capping layer, wherein the second capping layer has a thickness of 30 nanometers (nm) to 60 nm.

According to some example embodiments, a display device includes: a substrate; organic light emitting diodes on the substrate; a capping layer on the organic light emitting diodes; and a thin film encapsulation layer on the capping layer, wherein the capping layer includes: a first capping layer on the organic light emitting diodes; a second capping layer on the first capping layer, the second capping layer having a refractive index greater than that of the first capping layer; and a third capping layer on the second capping layer, the third capping layer having a refractive index smaller than that of the second capping layer, wherein the second capping layer has a refractive index in a range of 1.61 to 2.3, and each of the first capping layer and the third capping layer has a refractive index in a range of 1.45 to 1.6, and wherein the second capping layer has a thickness of 30 nanometers (nm) to 60 nm.

According to some example embodiments, a display device includes: a substrate; a display element on the substrate; a capping layer on the display element; and a thin film encapsulation layer on the capping layer, wherein the capping layer includes: a first capping layer on the display element; and a second capping layer between the first capping layer and the thin film encapsulation layer, wherein the second capping layer is interposed between the first capping layer and the thin film encapsulation layer, and the second capping layer has a refractive index smaller than that of the first capping layer and larger than that of the thin film encapsulation layer.

The display device according to some example embodiments of the present disclosure may reduce the overall amount of movement in the color temperature direction by arranging a plurality of capping layers with a controlled refractive index and thickness between the display element and the sealing member.

The characteristics of embodiments according to the present disclosure are not limited to the aforementioned characteristics, and various other characteristics are included in the present specification.

BRIEF DESCRIPTION OF THE DRAWINGS

The above and other aspects and characteristics of embodiments according to the present disclosure will become more apparent by describing in detail aspects of some example embodiments thereof with reference to the attached drawings, in which.

DETAILED DESCRIPTION

Figure 1:
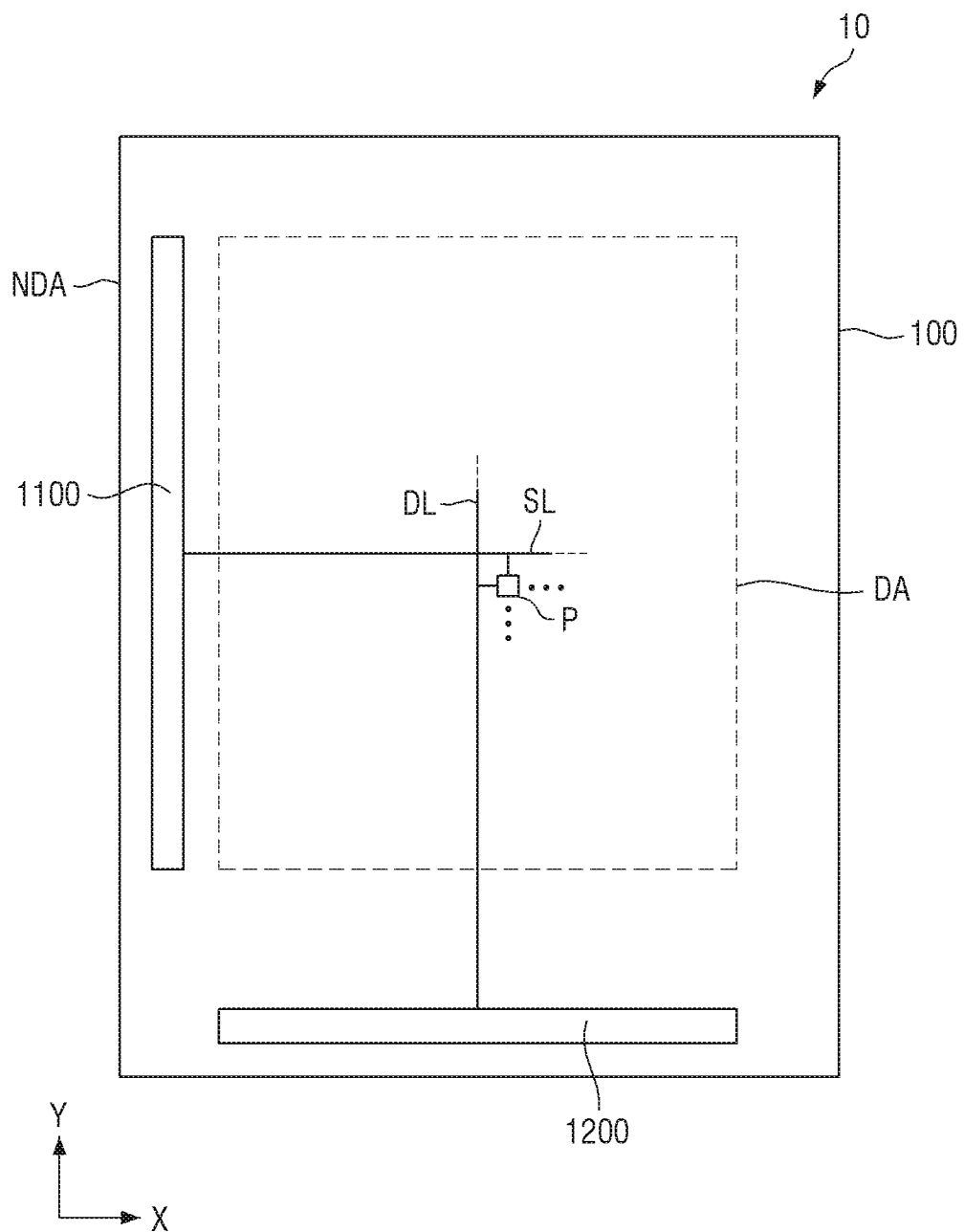
FIG. 1 is a plan view schematically illustrating a display device according to some example embodiments.

Aspects of some example embodiments of the present disclosure may allow for a variety of modifications and have various embodiments, and specific embodiments will be illustrated in the drawings and described in more detail in the detailed description. Characteristics and features of embodiments according to the present disclosure and methods of accomplishing the same may be understood more readily by reference to the following detailed description of example embodiments and the accompanying drawings. However, embodiments according to the present disclosure are not limited to the example embodiments disclosed below, but may be implemented in various forms.

Hereinafter, further details of some example embodiments of the present disclosure will be described in more detail with reference to the accompanying drawings. In the description with reference to the drawings, the same or corresponding elements are denoted by the same reference numerals, and a redundant description thereof will be omitted.

In the following example embodiments, it will be understood that, although the terms such as "first" and "second" may be used herein to describe various elements, these elements should not be limited by these terms. These terms are only used to distinguish one element from another element.

In the following embodiment, the singular forms, "a," "an," and "the" are intended to include the plural forms as well, unless the context clearly indicates otherwise.

The terms "comprising," "including," and "having," when used in the following embodiment, specify the presence of stated features, integers, steps, operations, elements, components, and/or groups thereof, but do not preclude the presence or addition of one or more other features, integers, steps, operations, elements, components, and/or groups thereof.

In the following example embodiments, it will be understood that when a portion such as a film, a region, an element, or the like is referred to as being "on" or "above" another portion, it can be directly "on" or "above" another portion, or another film, region, element, or the like may be interposed therebetween.

In the drawings, respective components may be enlarged or reduced in size for convenience of explanation. For example, because the size and thickness of each element illustrated in the drawings are arbitrarily illustrated for convenience of description, embodiments according to the present disclosure are not necessarily limited to what is illustrated.

When a certain embodiment may be implemented differently, a specific process order may be performed differently from the described order. For example, two consecutively described processes may be performed substantially at the same time or performed in an order opposite to the described order.

In the following example embodiments, when films, regions, or components are connected to each other, the films, the regions, or the components may not only be directly connected to each other, but may also be indirectly connected to each other as another film, another region, or another component is disposed therebetween. For example, when films, regions, or components are electrically connected to each other, the films, the regions, or the components may not only be directly electrically connected to each other, but may also be indirectly electrically connected to each other as another film, another region, or another component is disposed therebetween.

In the following example embodiments, the x-axis, y-axis, and z-axis are not limited to three axes on the Cartesian coordinate system, and may be interpreted in a broad sense including the same. For example, the x-axis, y-axis, and z-axis may be orthogonal to each other, but may refer to different directions that are not orthogonal to each other.

In the present specification, "A and/or B" represents A, B, or A and B.

FIG. 1 is a plan view schematically illustrating a display device according to some example embodiments.

Referring to FIG. 1, a display device 10 may include a display area DA and a non-display area NDA adjacent to the display area DA. The display device 10 includes a plurality of pixel regions P disposed in the display area DA. A display element capable of emitting light of a color (e.g., a set or predetermined color) is disposed in each pixel region P, and the display element can be connected to a scan line SL and a data line DL. FIG. 1 may be understood as a state of a substrate 100 in the display device 10. For example, it can be understood that the substrate 100 has the display area DA and the non-display area NDA.

In the non-display area NDA, a scan driver 1100 that provides a scan signal to each pixel region P through the scan line SL, a data driver 1200 that provides a data signal to a display element provided in each pixel region P through the data line DL, and main power wiring for providing first and second power supply voltages may be disposed.

FIG. 1 illustrates that the data driver 1200 is disposed on the substrate 100, but according to some example embodiments, the data driver 1200 may be disposed on a flexible printed circuit board (FPCB) electrically connected to a pad disposed on one side of the display device 10.

The display device 10 according to some example embodiments of the present disclosure may include an organic light emitting display, an inorganic light emitting display, a quantum dot display, or the like. Hereinafter, as the display device according to some example embodiments of the present disclosure, an organic light emitting display will be described as an example, but the display device according to embodiments of the present disclosure is not limited thereto, and features to be described later may be applied to various types of display devices as described above.

Figure 2:
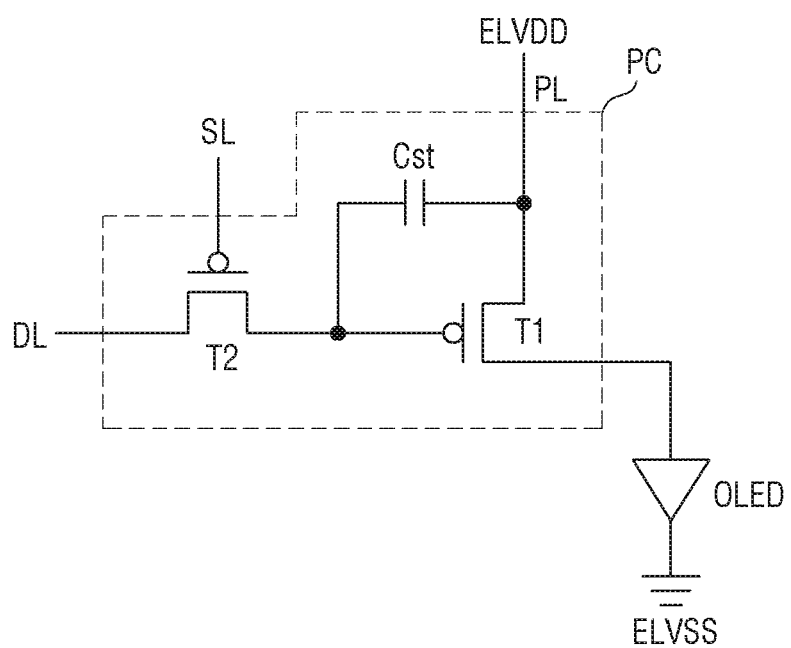
FIG. 2 illustrates a display element disposed in one pixel region of a display device according to some example embodiments and a pixel circuit connected thereto.

FIG. 2 illustrates a display element disposed in one pixel region of a display device according to some example embodiments and a pixel circuit connected thereto.

Referring to FIG. 2, an organic light emitting diode OLED, which is a display element, is connected to a pixel circuit PC. The pixel circuit PC may include a first thin film transistor T1, a second thin film transistor T2, and a storage capacitor Cst. The organic light emitting diode OLED may emit, for example, red, green, or blue light, or emit red, green, blue, or white light.

The second thin film transistor T2 is a switching thin film transistor and is connected to the scan line SL and the data line DL, and may transfer the data voltage, which is input from the data line DL according to the switching voltage input from the scan line SL, to the first thin film transistor T1. The storage capacitor Cst may be connected to the second thin film transistor T2 and a driving voltage line PL. The storage capacitor Cst may store a voltage corresponding to a difference between a voltage received from the second thin film transistor T2 and a first power supply voltage ELVDD supplied to the driving voltage line PL.

The first thin film transistor T1 may be, as a driving thin film transistor, connected to the driving voltage line PL and the storage capacitor Cst, and may control a driving current flowing through the organic light emitting diode OLED from the driving voltage line PL in response to the voltage value stored in the storage capacitor Cst. The organic light emitting diode OLED may emit light having a luminance (e.g., a set or predetermined luminance) by the driving current. The counter electrode (e.g., cathode) of the organic light emitting diode OLED may be supplied with a second power supply voltage ELVSS.

FIG. 2 illustrates that the pixel circuit PC includes two thin film transistors and one storage capacitor, but according to some example embodiments, the number of thin film transistors or the number of storage capacitors, of course, may be variously modified depending on the design of the pixel circuit PC.

Figure 3:
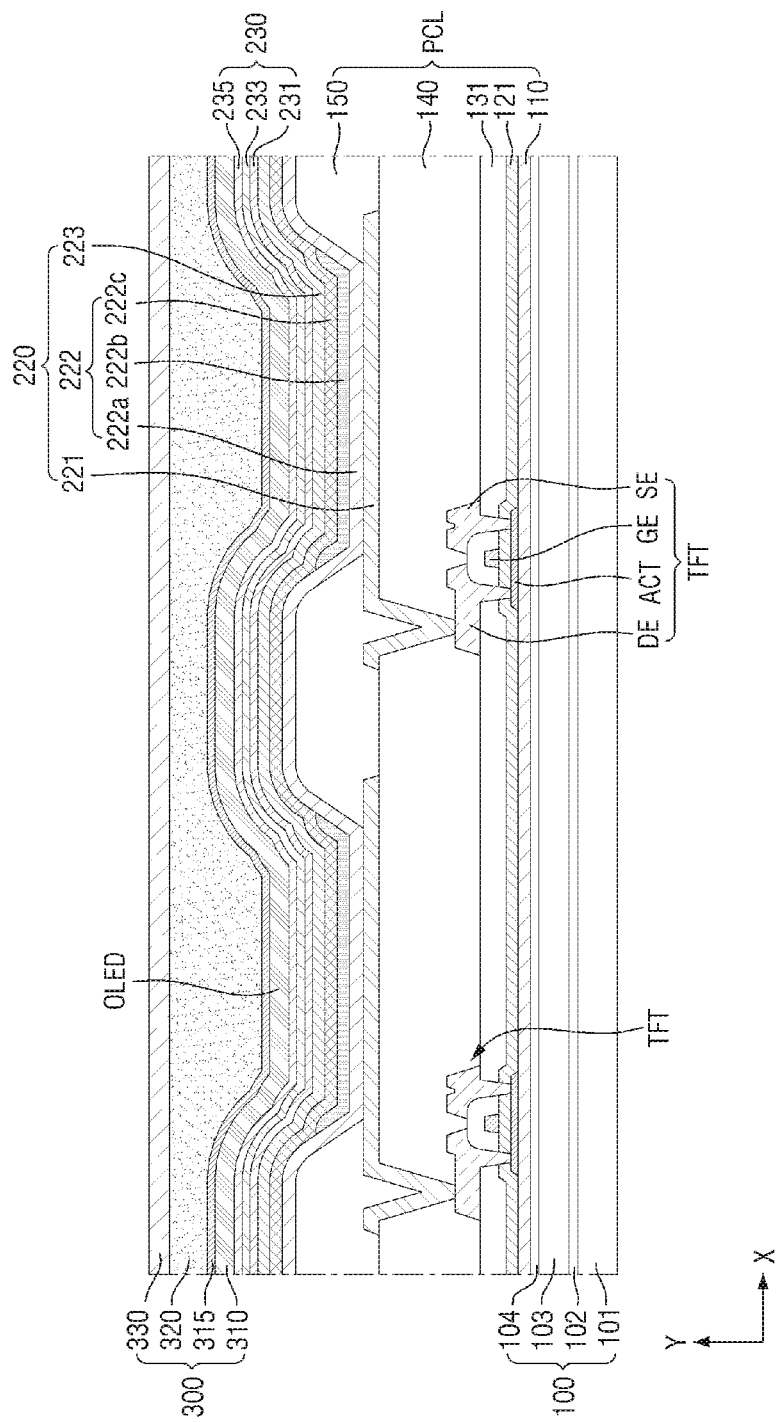
FIG. 3 is a cross-sectional view illustrating a portion of a display device according to some example embodiments.

FIG. 3 is a cross-sectional view illustrating a portion of a display device according to some example embodiments.

Referring to FIG. 3, a pixel circuit layer PCL including a pixel circuit is disposed on the substrate 100, the organic light emitting diode OLED as a display element is disposed on the pixel circuit layer PCL, which is covered by a thin film encapsulation layer 300.

The substrate 100 may include a polymer resin. The substrate 100 including the polymer resin may have flexible, rollable, or bendable characteristics.

According to some example embodiments, the substrate 100 may include a first base layer 101, a first barrier layer 102, a second base layer 103, and a second barrier layer 104 as illustrated in FIG. 3. Each of the first base layer 101 and the second base layer 103 may include a polymer resin. For example, the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and cellulose acetate propionate (CAP). The first barrier layer 102 and the second barrier layer 104 are barrier layers that prevent the penetration of foreign substances, and may be a single layer or a multilayer including inorganic materials such as silicon nitride and silicon oxide.

Figure 4:
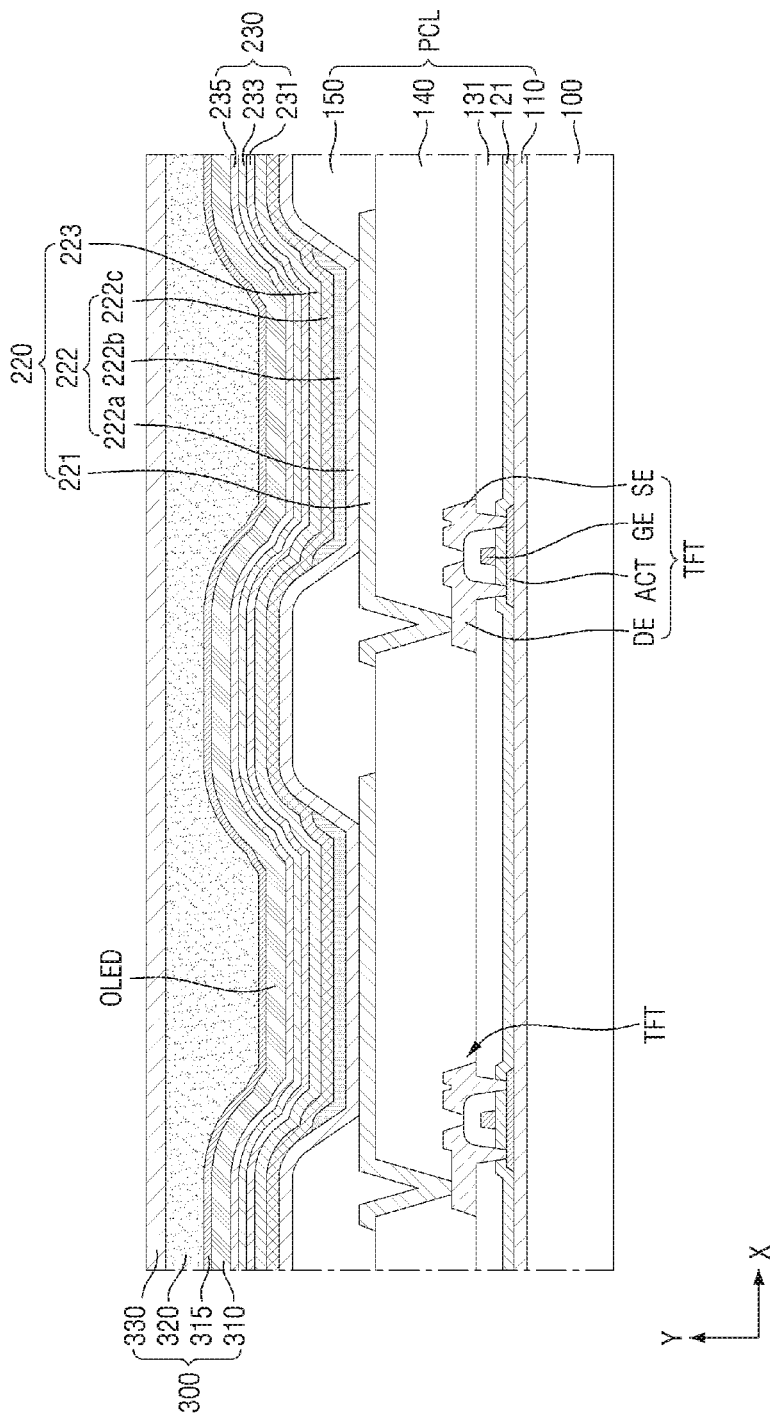
FIG. 4 is a cross-sectional view illustrating a portion of a display device according to a modified example of the display device according to FIG. 3.

FIG. 4 is a cross-sectional view illustrating a portion of a display device according to a modified example of the display device according to FIG. 3.

As a modified example, the substrate 100 may be a single layer including a glass material as illustrated in FIG. 4. For example, the substrate 100 may be a glass substrate with $SiO_2$ as a main component.

Referring to FIG. 3 again, the pixel circuit layer PCL on the above-described substrate 100 may include a thin film transistor TFT, and although not illustrated, may include a storage capacitor connected to the thin film transistor TFT. The structure of the thin film transistor TFT may have the same structure for each pixel. Each thin film transistor TFT may be connected to a display element provided in each pixel.

The thin film transistor TFT may include a semiconductor layer ACT including amorphous silicon, polycrystalline silicon, or an organic semiconductor material, a gate electrode GE, a source electrode SE, and a drain electrode DE. In order to secure the insulating property between the semiconductor layer ACT and the gate electrode GE, a gate insulating layer 121 including an inorganic material such as silicon oxide, silicon nitride, and/or silicon oxynitride may be interposed between the semiconductor layer ACT and the gate electrode GE. An interlayer insulating layer 131 including an inorganic material such as silicon oxide, silicon nitride, and/or silicon oxynitride may be disposed on the gate electrode GE, and the source electrode SE and the drain electrode DE may be disposed on the interlayer insulating layer 131 described above. The insulating layer containing the inorganic material may be formed through chemical vapor deposition (CVD) or atomic layer deposition (ALD).

The gate electrode GE, the source electrode SE, and the drain electrode DE may be formed of various conductive materials. The gate electrode GE may include molybdenum or aluminum, and may have a single layer or multilayer structure. For example, the gate electrode GE may be a single layer of molybdenum, or may have a three-layer structure including a molybdenum layer, an aluminum layer, and a molybdenum layer. The source electrode SE and the drain electrode DE may include titanium or aluminum, and may have a single layer or a multilayer structure. According to some example embodiments, the source electrode SE and the drain electrode DE may have a three-layer structure including a titanium layer, an aluminum layer, and a titanium layer.

A buffer layer 110 including an inorganic material such as silicon oxide, silicon nitride, and/or silicon oxynitride may be interposed between the thin film transistor TFT and the substrate 100 having the above-described structure. The buffer layer 110 may serve to enhance the smoothness of the upper surface of the substrate 100 or to prevent (or minimize) impurities from penetrating from the substrate 100 or the like into the semiconductor layer ACT of the thin film transistor TFT.

A planarization insulating layer 140 may be disposed on the thin film transistor TFT. The planarization insulating layer 140 may be formed of an organic material such as acryl, benzocyclobutene (BCB), or hexamethyldisiloxane (HMDSO). In FIG. 3, the planarization insulating layer 140 is illustrated as a single layer, but may be a multilayer.

The organic light emitting diode OLED includes a pixel electrode 221, an intermediate layer 222, and a counter electrode 223.

The pixel electrode 221 is disposed on the planarization insulating layer 140, and may be disposed, one for each pixel. The pixel electrode 221 may be a reflective electrode. According to some example embodiments, the pixel electrode 221 may include a reflective film containing silver (Ag), magnesium (Mg), aluminum (Al), platinum (Pt), palladium (Pd), gold (Au), nickel (Ni), neodymium (Nd), iridium (Ir), chromium (Cr) or a compound thereof. According to some example embodiments, the pixel electrode 221 may include a transparent or translucent electrode layer disposed above and/or below the reflective film described above. The above-described transparent or translucent electrode layer includes at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a three-layer structure of an ITO layer, an Ag layer, and an ITO layer.

A pixel defining film 150 is disposed on the pixel electrodes 210. The pixel defining film 150 has an opening 150OP exposing the central portion of each pixel electrode 210. The pixel defining film 150 may increase the distance between the edge of the pixel electrode 210 and the counter electrode 223, thereby preventing arc or the like from occurring at the edge of the pixel electrode 210. The pixel defining film 150 is an organic insulating material such as polyimide, polyamide, acrylic resin, benzocyclobutene, hexamethyldisiloxane (HMDSO), and phenol resin, and may be formed by a method such as spin coating.

A light emitting layer 222b may be disposed on the pixel electrode 210 exposed through the opening 150OP of the pixel defining film 150. The light emitting layer 222b may be an organic material including a fluorescent or phosphorescent material capable of emitting red, green, or red light. The above-described organic material may be a low molecular organic material or a high molecular organic material.

A first functional layer 222a and a second functional layer 222c may be disposed below and above the light emitting layer 222b, respectively. The first functional layer 222a may include, for example, a hole transport layer (HTL), or a hole transport layer and a hole injection layer (HIL). The second functional layer 222c is an element disposed on the light emitting layer 222b, and may include an electron transport layer (ETL) and/or an electron injection layer (EIL). The second functional layer 222c is optional. In some embodiments, the second functional layer 222c may not be provided.

While the light emitting layers 222b are respectively disposed to correspond to the openings of the pixel defining film 150, the first functional layer 222a and the second functional layer 222c may be a common layer that are integrally formed to cover the substrate 100 as a whole, in the same way as the counter electrode 223 to be described later, for example, to cover the entire display area of the substrate 100.

The counter electrode 223 may include a (semi) transparent layer containing silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), an alloy thereof or the like. Alternatively, the counter electrode 223 may further include a layer such as ITO, IZO, ZnO or $In_2O_3$ on the (semi) transparent layer containing the aforementioned material. According to some example embodiments, the counter electrode 223 may include silver (Ag), magnesium (Mg), or an alloy of silver (Ag) and magnesium (Mg).

A capping layer 230 may be disposed on the counter electrode 223. For example, the capping layer 230 may include LiF, an inorganic insulating material, or an organic insulating material. The capping layer 230 may cover and protect the above-described counter electrode 223 from the top.

The capping layer 230 may include a plurality of stacked films. The plurality of stacked films may include a first capping layer 231 on the counter electrode 223, a second capping layer 233 on the first capping layer 231, and a third capping layer 235 on the second capping layer 233.

The first capping layer 231 may be disposed between the counter electrode 223 and the second capping layer 233, the second capping layer 233 may be disposed between the first capping layer 231 and the third capping layer 235, and the third capping layer 235 may be disposed between the second capping layer 233 and the thin film encapsulation layer 300. The first capping layer 231 may be interposed between the counter electrode 223 and the second capping layer 233, the second capping layer 233 may be interposed between the first capping layer 231 and the third capping layer 235, and the third capping layer 235 may be interposed between the second capping layer 233 and the thin film encapsulation layer 300. The term 'interposed' as used herein means that a corresponding component is in direct contact with upper and lower components between which the corresponding component is interposed. The first capping layer 231 may contact the counter electrode 223 and the second capping layer 233, respectively, the second capping layer 233 may contact the first capping layer 231 and the third capping layer 235, respectively, and the third capping layer 235 may contact the second capping layer 233 and the thin film encapsulation layer 300, respectively.

For example, the capping layer 230 may include an inorganic insulating material. For example, the capping layer 230 may include one or more inorganic insulating materials selected from the group consisting of aluminum oxide, titanium oxide, tantalum oxide, hafnium oxide, zinc oxide, silicon oxide, silicon nitride and silicon oxynitride. The materials of the plurality of stacked films of the capping layer 230 may be different from each other, but may be the same.

As described above, the display elements provided in the display device emits light of a color (e.g., a set or predetermined color) to provide an image, and the emitted light may pass through the thin film encapsulation layer 300 to be described later to seal the display elements. According to some example embodiments, when the thin film encapsulation layer 300 has a structure in which a plurality of layers are stacked, light emitted from the display element may undergo interference due to the film thickness of the thin film encapsulation layer 300. The overall amount of movement in the color temperature direction on the minimum perceptible color difference (MPCD) may be increased by the generated interference.

However, according to some example embodiments, the refractive index and thickness of the plurality of stacked films of the capping layer 230 are adjusted, so that the overall amount of movement in the color temperature direction on the minimal perceptible color difference (MPCD) by the generated interference may be prevented in advance from increasing. A detailed description thereof will be given later.

The thin film encapsulation layer 300 may be disposed on the capping layer 230. The thin film encapsulation layer 300 may include at least one inorganic encapsulation layer and at least one organic encapsulation layer. For example, as illustrated in FIG. 4, the thin film encapsulation layer 300 includes a first inorganic encapsulation layer 310 on the third capping layer 235, an organic encapsulation layer 320 on the first inorganic encapsulation layer 310, and a second inorganic encapsulation layer 330 on the organic encapsulation layer 320, but includes an auxiliary layer 315 interposed between the first inorganic encapsulation layer 310 and the organic encapsulation layer 320.

The first inorganic encapsulation layer 310 and the second inorganic encapsulation layer 330 may include one or more inorganic insulating materials selected from the group consisting of aluminum oxide, titanium oxide, tantalum oxide, hafnium oxide, zinc oxide, silicon oxide, silicon nitride and silicon oxynitride. In some embodiments, the first inorganic encapsulation layer 310 and the second inorganic encapsulation layer 330 may include an inorganic insulating layer including a non-metallic element, such as silicon oxide, silicon nitride, or silicon oxynitride. The number and type of non-metallic elements included in the first inorganic encapsulation layer 310 may be different from the number and type of non-metallic elements included in the second inorganic encapsulation layer 330. For example, the first inorganic encapsulation layer 310 may include silicon oxynitride, and the second inorganic encapsulation layer 330 may include silicon nitride, but they are not limited hereto.

The organic encapsulation layer 320 may relieve internal stress of the first inorganic encapsulation layer 310 and/or the second inorganic encapsulation layer 330. The organic encapsulation layer 320 may include a polymer-based material. Polymer-based materials may include polyethylene terephthalate, polyethylene naphthalate, polycarbonate, polyimide, polyethylene sulfonate, polyoxymethylene, polyarylate, hexamethyldisiloxane, and acrylic resins (e.g., polymethyl methacrylate, polyacrylic acid, or the like), or any combination thereof.

The organic encapsulation layer 320 may be formed by applying a monomer having flow property and curing the monomer layer using heat or light such as ultraviolet light. Alternatively, the organic encapsulation layer 320 may be formed by applying the above-described polymer-based material.

The auxiliary layer 315 is interposed between the first inorganic encapsulation layer 310 and the organic encapsulation layer 320. The auxiliary layer 315 may directly contact the first inorganic encapsulation layer 310 and the organic encapsulation layer 320. For example, the bottom surface of the auxiliary layer 315 may directly contact the top surface of the first inorganic encapsulation layer 310, and the top surface of the auxiliary layer 315 may directly contact the bottom surface of the organic encapsulation layer 320.

The auxiliary layer 315 may be an inorganic insulating layer containing a non-metal element. According to some example embodiments, the non-metal element contained in the auxiliary layer 315 may be the same non-metal element as in the first inorganic encapsulation layer 310, and the non-metal element is, for example, silicon (Si), oxygen (O), and nitrogen (N).

The light emitted from the organic light emitting diode OLED disposed in each pixel passes through the thin film encapsulation layer 300 to the outside. At this time, as described above, the overall amount of movement in the color temperature direction on the minimum perceptible color difference (MPCD) may increase when viewed from the direction (e.g., the z direction) perpendicular to and a direction oblique to the substrate 100, due to the thin film interference phenomenon of the thin film encapsulation layer 300. However, according to some example embodiments, the refractive index and thickness of the plurality of stacked films of the capping layer 230 are adjusted, so that the overall amount of movement in the color temperature direction on the minimal perceptible color difference (MPCD) by the generated interference may be prevented in advance from increasing.

Figure 5:
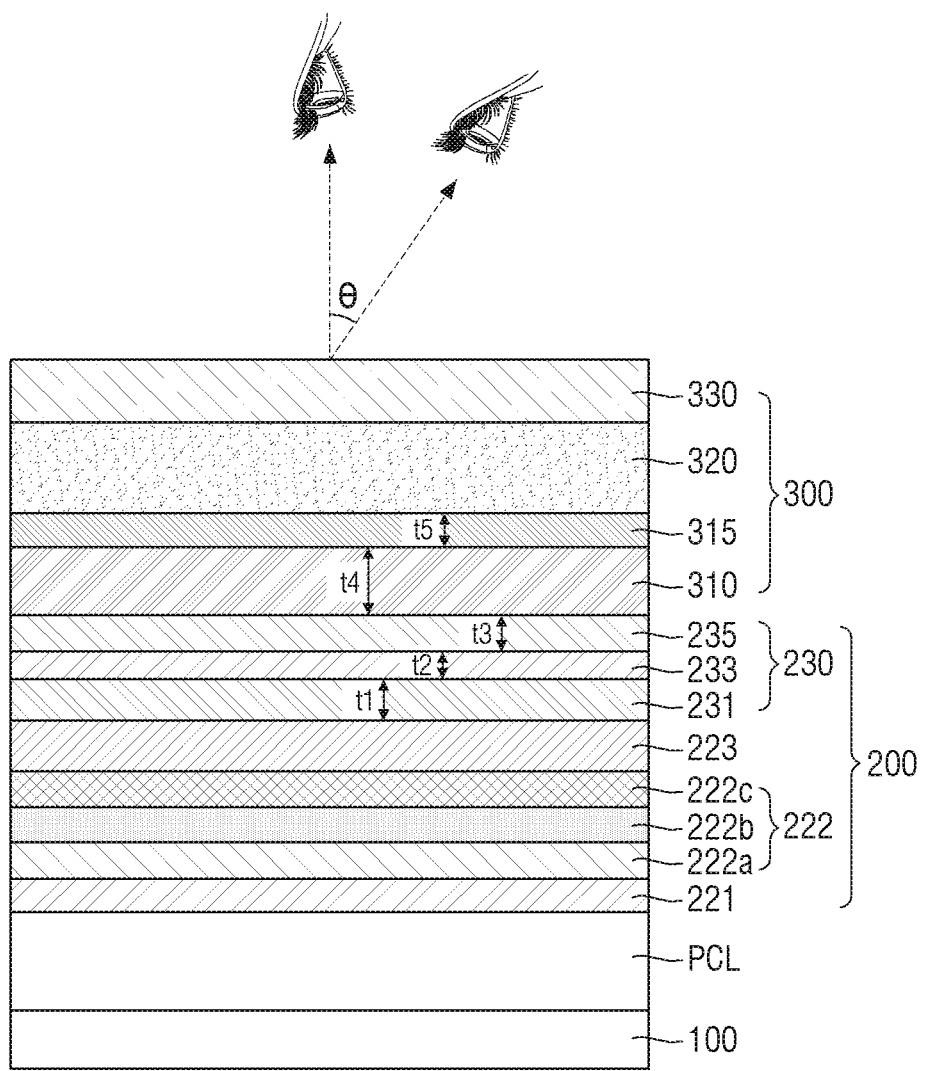
FIG. 5 is a schematic diagram schematically illustrating a display device according to some example embodiments.

FIG. 5 is a schematic diagram schematically illustrating a display device according to some example embodiments.

Referring to FIG. 5, the display device 10 includes the substrate 100, the pixel circuit layer PCL, a display layer 200 including the pixel electrode 221, the intermediate layer 222, the counter electrode 223, and the capping layer 230, and the thin film encapsulation layer 300, which are sequentially stacked.

The capping layer 230 may include the first capping layer 231, the second capping layer 233, and the third capping layer 235 which are sequentially disposed along a light traveling direction (or a direction from the display layer 200 toward the thin film encapsulation layer 300).

The thin film encapsulation layer 300 may include the first inorganic encapsulation layer 310 and the auxiliary layer 315 sequentially disposed along a light traveling direction (or a direction from the display layer 200 toward the thin film encapsulation layer 300). The organic encapsulation layer 320 and the second inorganic encapsulation layer 330 may be disposed on the auxiliary layer 315.

The refractive index of the second capping layer 233 may be larger than each of the refractive index of the first capping layer 231 and the refractive index of the third capping layer 235. For example, the refractive index of the second capping layer 233 may have a value of 1.61 to 2.3. Each of the refractive index of the first capping layer 231 and the refractive index of the third capping layer 235 may have a value of 1.45 to 1.6. The refractive index of the first capping layer 231 and the refractive index of the third capping layer 235 may be the same but are not limited thereto, and the refractive index of the first capping layer 231 and the refractive index of the third capping layer 235 may be different from each other. For example, the refractive index of the second capping layer 233 may be about 1.97, the refractive index of the first capping layer 231 may be about 1.52, and the refractive index of the third capping layer 235 may be about 1.52, but they are not limited thereto.

The first capping layer 231 may have a first thickness t1. The first thickness t1 may range from about 30 nm to about 40 nm.

The second capping layer 233 may have a second thickness t2. The second thickness t2 may range from about 30 nm to about 60 nm. According to some example embodiments, the second thickness t2 may range from about 30 nm to about 40 nm. For example, the second thickness t2 may be about 35 nm.

The third capping layer 235 may have a third thickness t3. The third thickness t3 may range from about 35 nm to about 45 nm.

According to some example embodiments, as described above, because the refractive index of the second capping layer 233 is larger than each of the refractive index of the first capping layer 231 and the refractive index of the third capping layer 235, and the second thickness t2 of the second capping layer 233 has a range of about 30 nm to about 40 nm, the overall amount of movement in the color temperature direction on the minimum perceptible color difference (MPCD) may be prevented in advance from increasing when viewed from the direction (e.g., the z direction) perpendicular to and a direction oblique to the substrate 100, due to the thin film interference phenomenon of the thin film encapsulation layer 300. Further, by having the second thickness t2 of the second capping layer 233 in a range of 60 nm or less, it is possible to prevent the second capping layer 233 from being peeled off or separated.

The first inorganic encapsulation layer 310 may be disposed on the third capping layer 235.

The first inorganic encapsulation layer 310 may have a fourth thickness t4 ranging from about 600 nm to 2200 nm. When the fourth thickness t4 of the first inorganic encapsulation layer 310 is 600 nm or more, moisture permeation can be prevented, and when the fourth thickness t4 of the first inorganic encapsulation layer 310 is 2200 nm or less, it is possible to prevent the first inorganic encapsulation layer 310 from being peeled off or separated. The thickness of the second inorganic encapsulation layer 330 may be the same as that of the first inorganic encapsulation layer 310, or may be smaller or larger than that of the first inorganic encapsulation layer 310.

On the other hand, light emitted from the display element passes through the thin film encapsulation layer 300 such that interference of light or the like occurs, and although it is designed by using the above-described capping layer 230 to prevent in advance the overall amount of movement in the color temperature direction on the minimum perceptible color difference (MPCD) from increasing when viewed from the direction (e.g., the z direction) perpendicular to and a direction oblique to the substrate 100, due to the thin film interference phenomenon of the thin film encapsulation layer 300, a variation in color coordinates may be large.

In order to solve this problem, a method of adjusting the thickness of the first inorganic encapsulation layer 310 may be considered, but controlling the thickness may not be practically easy due to the error of an equipment itself (e.g., a CVD equipment) forming the first inorganic encapsulation layer 310. For example, the first inorganic encapsulation layer 310 which protects the display layer 200 from moisture or the like may have a thickness range of about 600 nm to 2200 nm as described above to prevent separation of the first inorganic encapsulation layer 310 or the like. When the error of the equipment forming the inorganic insulating layer is about 10%, a deviation in the thickness of the first inorganic encapsulation layer 310 that is actually formed corresponds to a range of tens to hundreds of nm. Thus, it is practically difficult to control the thickness of the first inorganic encapsulation layer 310 to reduce a variation in the minimal perceptible color difference (MPCD) and there may be a limitation in reducing a variation in the above-described MPCD.

The thin film encapsulation layer 300 according to some example embodiments arranges the auxiliary layer 315 on the first inorganic encapsulation layer 310, thereby reducing a variation in the above-described MPCD regardless of the thickness of the first inorganic encapsulation layer 310.

The auxiliary layer 315 may be formed of an inorganic insulating material, and the fifth thickness t5 of the auxiliary layer 315 for minimizing or preventing a variation in the MPCD described above may be 100 nm or less. For example, the fifth thickness t5 of the auxiliary layer 315 may be 30 nm to 100 nm. When the fifth thickness t5 of the auxiliary layer 315 is 100 nm or less, control of the fifth thickness t5 of the auxiliary layer 315 may be easily performed.

The auxiliary layer 315 includes an inorganic insulating material. As described above, the inorganic insulating material layer formed by using the CVD equipment may have an error of about 10% in the thickness actually formed when compared to a target thickness. Because the auxiliary layer 315 may be formed using the CVD equipment in the same way as the first inorganic encapsulation layer 310, the thickness of the auxiliary layer 315 actually formed may be different from the target thickness. However, because the auxiliary layer 315 is more than tens of times smaller than the thickness of the first inorganic encapsulation layer 310, it is much easier to control the thickness of the auxiliary layer 315 despite the error (for example, an error of about 10%) of the thickness according to the CVD equipment.

The first inorganic encapsulation layer 310 and the auxiliary layer 315 may have different refractive indices. For example, a refractive index n3 of the auxiliary layer 315 may satisfy the following condition:

$$\min(n1,n2)+|n2-n1|\times 0.25 < n3 < \min(n1,n2)+|n2-n1|\times 0.75$$

Here, n1 represents the refractive index of the first inorganic encapsulation layer, n2 represents the refractive index of the organic encapsulation layer, min(n1, n2) represents the minimum value of n1 and n2, and |n2−n1| represents the absolute value of the difference between n2 and n1.

When the refractive index n3 of the auxiliary layer 315 is within the above-described range, it is possible to minimize or prevent the occurrence of a large variation of the MPCD.

Figure 6:
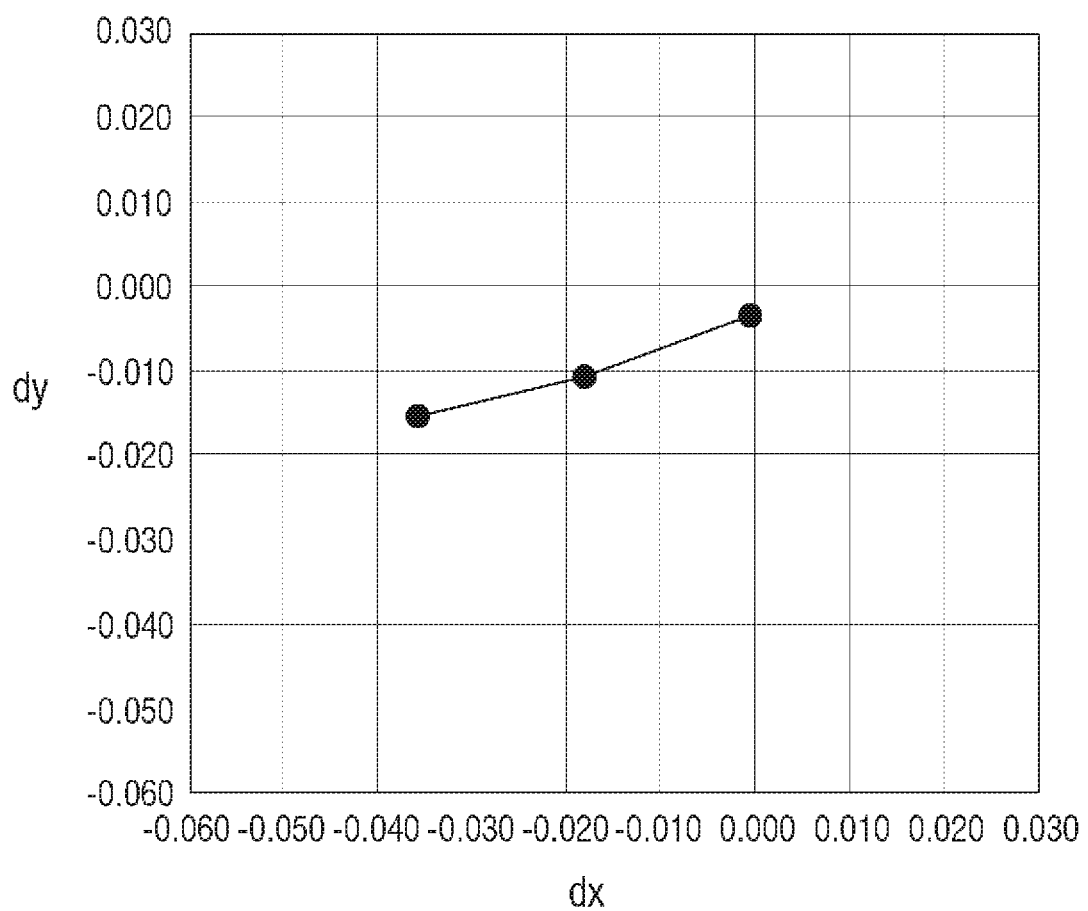
FIG. 6 is a diagram illustrating a minimal perceptible color difference (MPCD) when the thickness of the second capping layer is about 23 nm.
Figure 7:
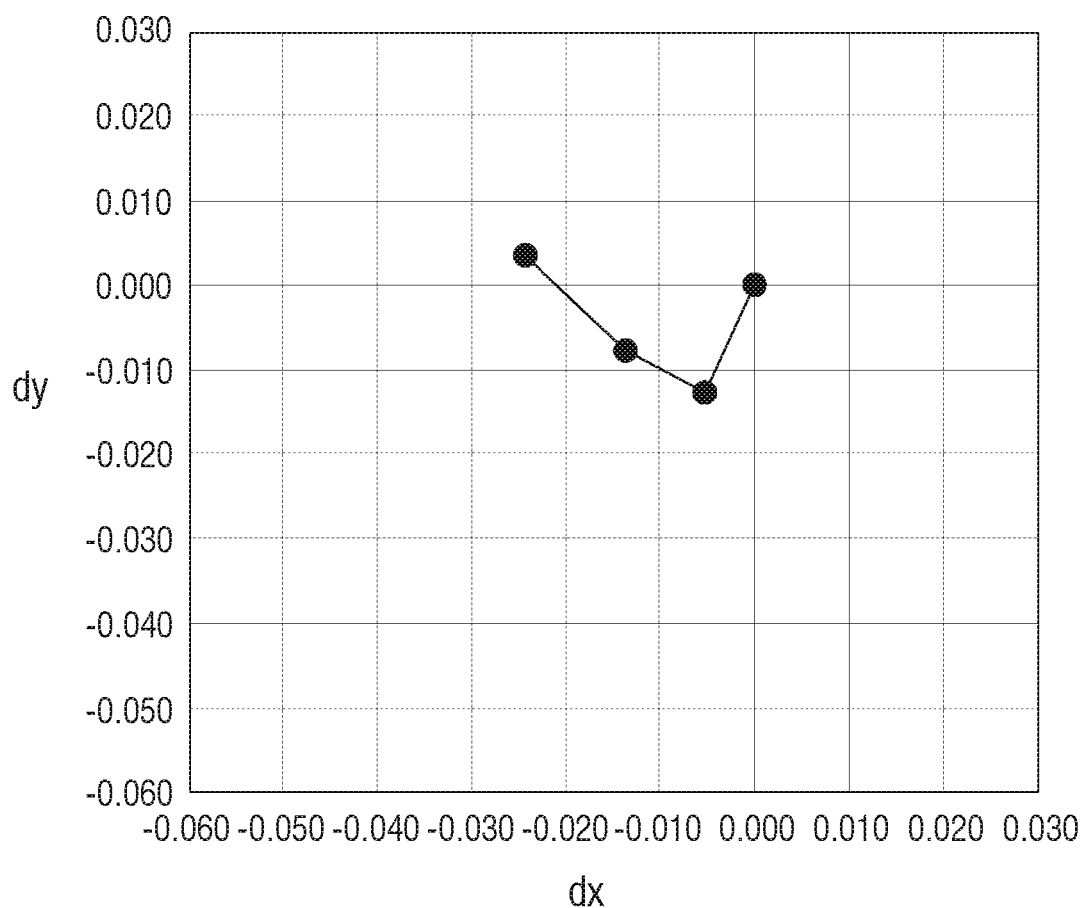
FIG. 7 is a view illustrating a minimum perceptible color difference (MPCD) when the second capping layer according to some example embodiments is applied.

FIG. 6 is a diagram illustrating a minimal perceptible color difference (MPCD) when the thickness of the second capping layer is about 23 nm. FIG. 7 is a view illustrating a minimum perceptible color difference (MPCD) when the second capping layer according to some example embodiments is applied.

Referring to FIGS. 6 and 7, the MPCD is illustrated as a contour line by dividing a section (e.g., a set or predetermined section), and the MPCD illustrates that having a negative (−) value in a direction (y-axis) away from 0 (zero) with respect to the vertical axis indicates a color turning bluish and having a positive (+) value in the direction (y-axis) away from 0 (zero) with respect to the vertical axis indicates a color turning greenish.

The contour line of the MPCD is illustrated based on the MPCD value when the display device 10 is viewed in a direction perpendicular to and a direction oblique to the substrate 100, for example, at 0° (z direction) and at an oblique angle of about 30°, 45°, and 60° with respect to the z direction, as illustrated in FIG. 5.

It can be seen that, according to some example embodiments as illustrated in FIG. 7, the overall amount in the color temperature direction in the MPCD of the display device 10 is small, compared to the embodiments described with respect to FIG. 6. For example, according to the embodiments illustrated with respect to FIG. 6, the overall change amount (dx) in the x-axis (dx) is about 0.038 and the overall change amount (dy) in the y-axis is about 0.015, and according to the embodiments illustrated with respect to FIG. 7, the overall change amount (dx) in the x-axis is about 0.025 and the overall change amount (dy) in the y-axis is about 0.012. That is, according to the embodiments illustrated with respect to FIG. 7, the amount of change in the x-axis was 0.013 smaller compared to the embodiments illustrated with respect to FIG. 6, and the amount of change in the y-axis was 0.003 smaller.

Accordingly, as confirmed from FIGS. 6 and 7, according to some example embodiments, because the refractive index of the second capping layer 233 is larger than the refractive index of the first capping layer 231 and the refractive index of the third capping layer 235, respectively and the second thickness t2 of the second capping layer 233 has a range of about 30 nm to about 40 nm, it is possible to prevent an increase in the overall amount of movement in the color temperature direction on the minimum perceptible color difference (MPCD) when viewed from the direction (e.g., the z direction) perpendicular to and a direction oblique to the substrate 100, due to the thin film interference phenomenon of the thin film encapsulation layer 300.

In some embodiments, in the display device according to some example embodiments, the thin film encapsulation layer 300 may include the first inorganic encapsulation layer 310 including a plurality of stacked films.

The first inorganic encapsulation layer 310 according to some example embodiments may include a plurality of stacked films. For example, the first inorganic encapsulation layer 310 may include a first sub inorganic encapsulation layer interposed between the third capping layer 235 and a second sub inorganic encapsulation layer, and the second sub inorganic encapsulation layer interposed between the first sub inorganic encapsulation layer and the auxiliary layer 315. In the present embodiment, although it is illustrated that the first inorganic encapsulation layer 310 includes two stacked films which are sequentially stacked, embodiments according to the present disclosure are not limited thereto, and the first inorganic encapsulation layer 310 may include three or more stacked films which are sequentially stacked.

The sum of the thicknesses of the first sub inorganic encapsulation layer and the second sub inorganic encapsulation layer may be designed to have a range (from about 600 nm to 2200 nm) of the fourth thickness t4 of the first inorganic encapsulation layer 310 described with reference to FIGS. 3 and 5. The thickness of the first sub inorganic encapsulation layer may be different from or the same as the thickness of the second sub inorganic encapsulation layer.

The refractive indices of the first sub inorganic encapsulation layer 310a and the second sub inorganic encapsulation layer 310b may be selected within the refractive index range of the first inorganic encapsulation layer 310 described above with reference to FIG. 5, respectively. For example, the refractive indices of the first sub inorganic encapsulation layer and the second sub inorganic encapsulation layer may be substantially the same.

Hereinafter, a display device according to some example embodiments will be described. According to some example embodiments, the same components as those of the above-described embodiment are denoted by the same reference numerals, and a description thereof will be omitted or simplified.

Figure 8:
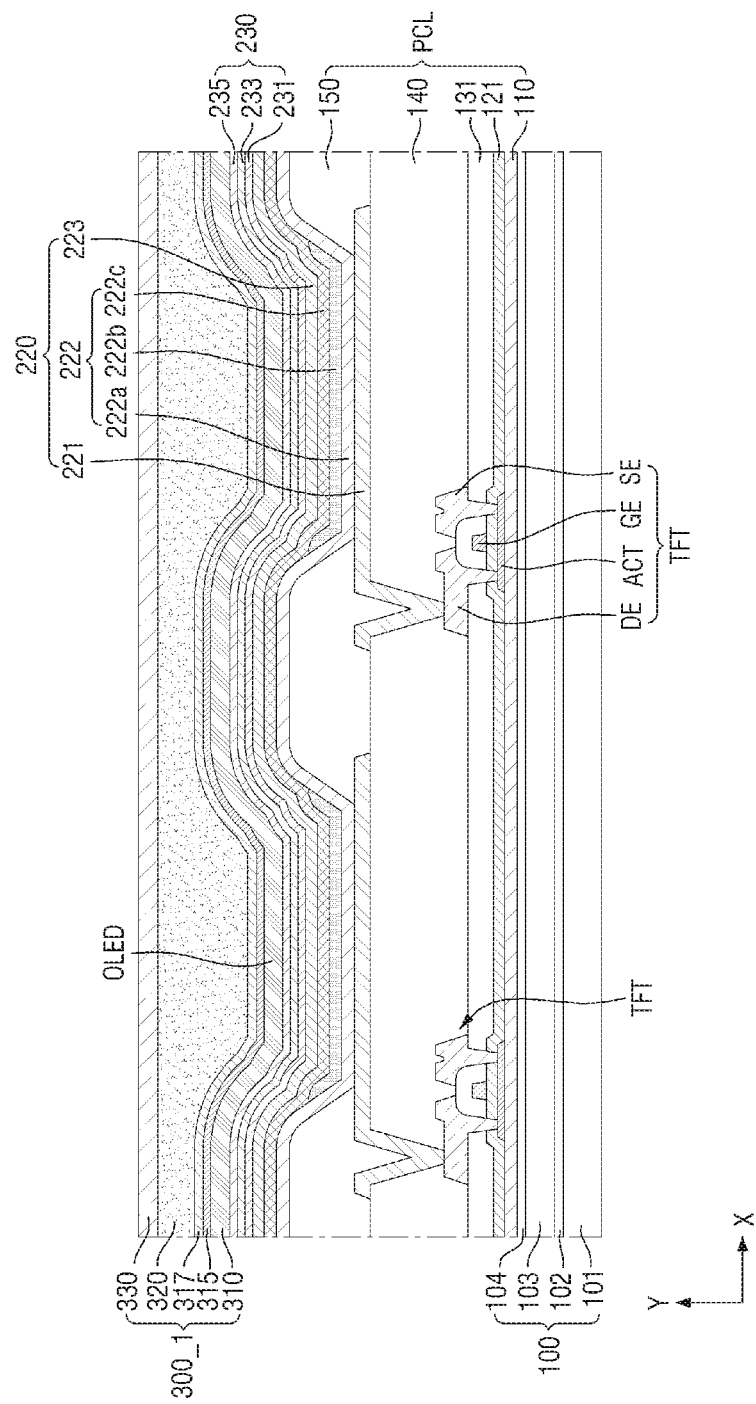
FIG. 8 is a cross-sectional view illustrating a portion of a display device according to some example embodiments.
Figure 9:
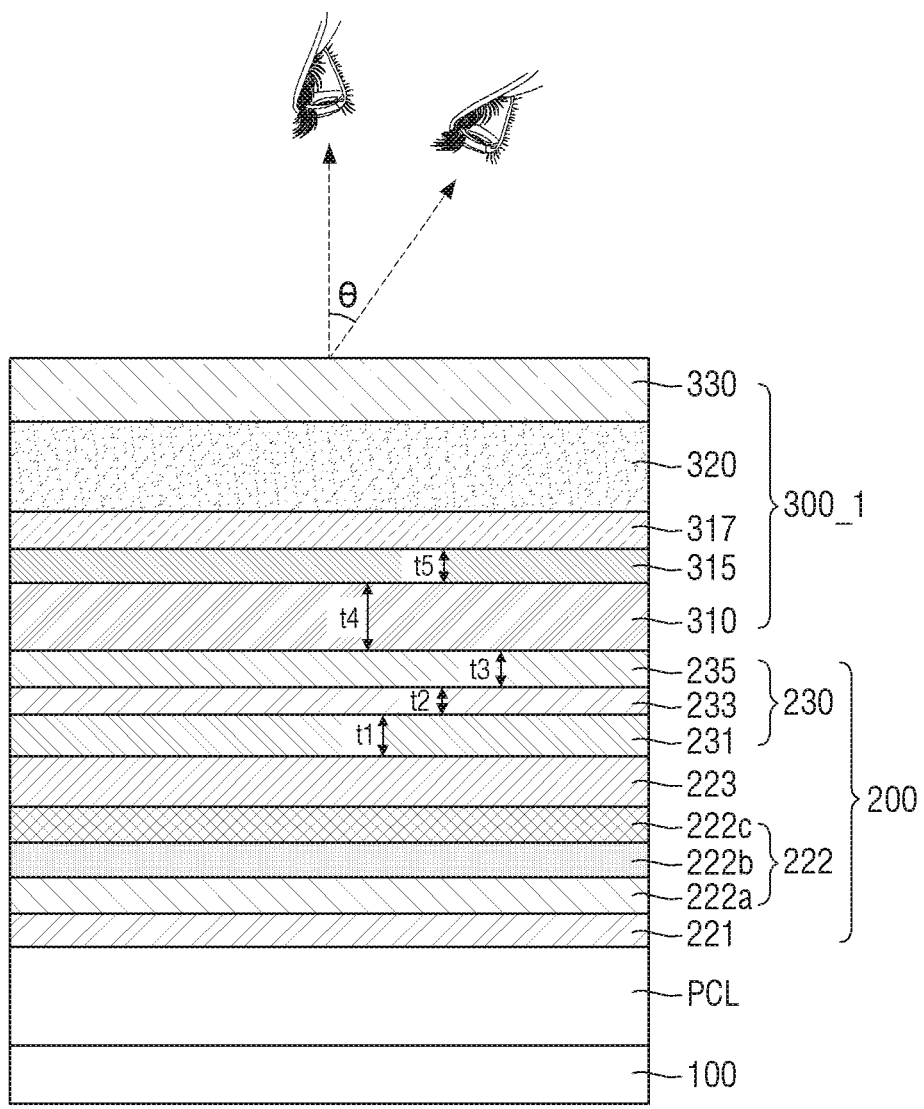
FIG. 9 is a schematic diagram schematically illustrating a display device according to some example embodiments.

FIG. 8 is a cross-sectional view illustrating a portion of a display device according to some example embodiments. FIG. 9 is a schematic diagram schematically illustrating a display device according to some example embodiments.

Referring to FIGS. 8 and 9, the display device may include the substrate 100, the pixel circuit layer PCL, the display layer 200, and a thin film encapsulation layer 300_1 which are sequentially stacked, but the thin film encapsulation layer 300_1 may further include a lower layer 317 disposed under the organic encapsulation layer 320. Except for the lower layer 317, the other elements are the same as those of the embodiments described with reference to FIGS. 3 and 5, so that the following description is focused on the lower layer 317.

The lower layer 317 may be interposed between the organic encapsulation layer 320 and the auxiliary layer 315.

The lower layer 317 may not have a role as a thin film encapsulation layer, for example, moisture permeability. The lower layer 317 may control a material forming the organic encapsulation layer 320 during the process of the organic encapsulation layer 320 formed by applying and curing the monomer.

The lower layer 317 may be a layer having no separate optical function as well as having no moisture permeability as described above, and the refractive index of the lower layer 317 may be substantially the same as the refractive index of the organic encapsulation layer 320. The fact that the refractive index of the lower layer 317 and the refractive index of the organic encapsulation layer 320 are substantially the same means that a difference $\Delta n$ between the refractive index of the lower layer 317 and the refractive index of the organic encapsulation layer 320 is less than 0.05. For example, the refractive index of the lower layer 317 may be 1.52.

The thickness of the lower layer 317 may be selected in the range of about 50 nm to 100 nm, such as about 55 nm to 90 nm or 60 nm to 85 nm. Although the refractive index of the lower layer 317 and the refractive index of the organic encapsulation layer 320 are substantially the same, an interface may exist between the lower layer 317 and the organic encapsulation layer 320 that are in contact with each other because they include different materials.

The lower layer 317 may include an inorganic insulating layer. For example, the lower layer 317 may contain a non-metallic element as do the first inorganic encapsulation layer 310 and the auxiliary layer 315, or may contain an element different from the non-metallic element included in the first inorganic encapsulation layer 310 and the auxiliary layer 315. For example, the lower layer 317 may be an inorganic insulating layer having a relatively high oxygen content, such as an O-rich silicon oxynitride layer.

For example, the first inorganic encapsulation layer 310, the auxiliary layer 315, and the lower layer 317 may all include the same non-metal element, such as silicon (Si), oxygen (O), and nitrogen (N). A first silicon oxynitride layer as the first inorganic encapsulation layer 310, a second silicon oxynitride layer as the auxiliary layer 315, and a third silicon oxynitride layer as the lower layer 317 have the different content ratios of silicon (Si), oxygen (O), and nitrogen (N), respectively. Accordingly, an interface may exist between the first silicon oxynitride layer and the second silicon oxynitride layer, and between the second silicon oxynitride layer and the third silicon oxynitride layer, respectively.

For example, the refractive index n3 of the auxiliary layer 315 may satisfy the following condition:

$$\min(n1,n2)+|n2-n1|\times 0.25 < n3 < \min(n1,n2)+|n2-n1|\times 0.75$$

Here, n1 represents the refractive index of the first inorganic encapsulation layer, n2 represents the refractive index of the organic encapsulation layer, min(n1, n2) represents the minimum value of n1 and n2, and |n2−n1| represents the absolute value of the difference between n2 and n1.

Even in the present embodiment, because the refractive index of the second capping layer 233 is larger than the refractive index of the first capping layer 231 and the refractive index of the third capping layer 235, respectively, and the second thickness t2 of the second capping layer 233 has a range of about 30 nm to about 40 nm, the overall amount of movement of the color temperature direction on the minimum perceptible color difference (MPCD) may be prevented in advance from increasing when viewed from the direction (e.g., the z direction) perpendicular to and a direction oblique to the substrate 100, due to the thin film interference phenomenon of the thin film encapsulation layer 300.

Figure 10:
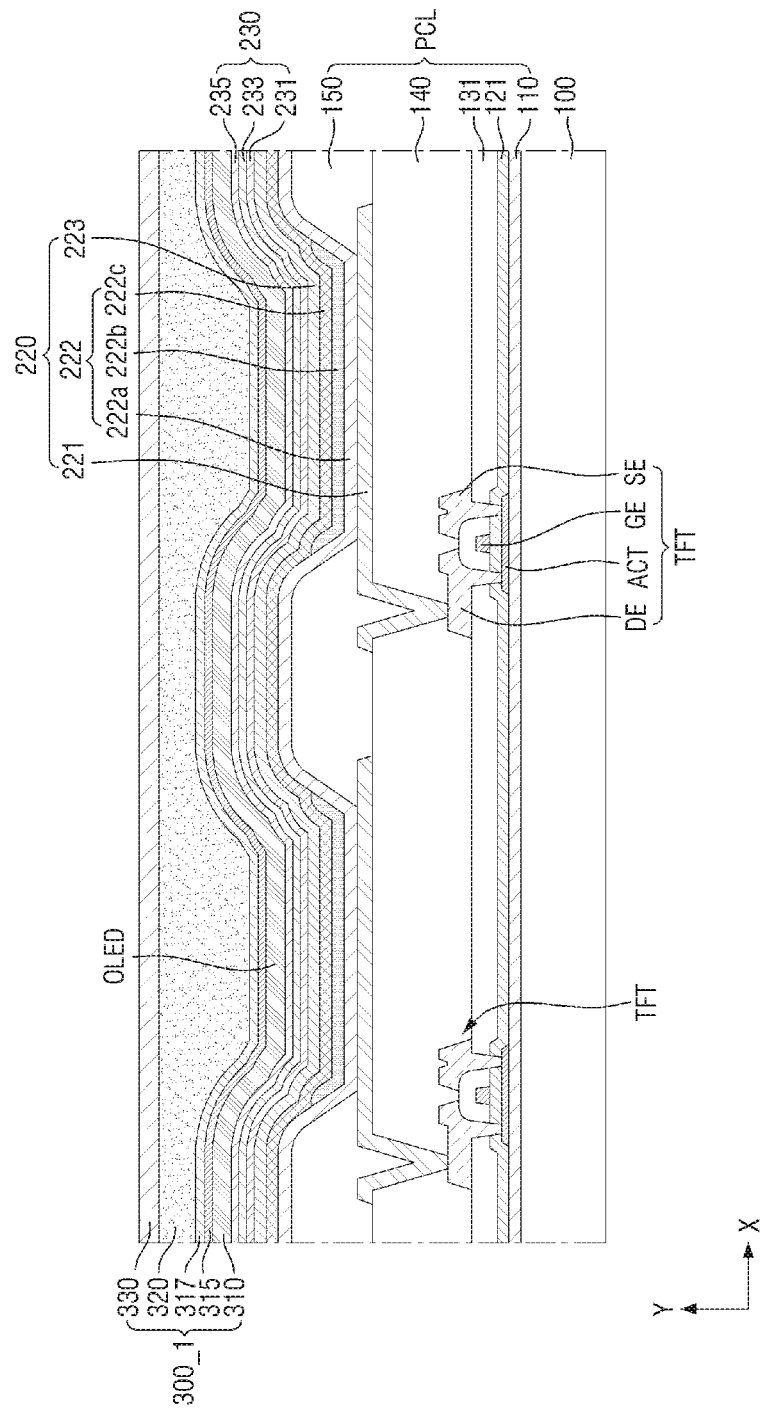
FIG. 10 is a cross-sectional view illustrating a portion of a display device according to a modified example of the display device according to FIG. 8.

FIG. 10 is a cross-sectional view illustrating a portion of a display device according to a modified example of the display device according to FIG. 8.

Referring to FIG. 10, as a modified example of FIG. 8, the substrate 100 may be a single layer including a glass material. For example, the substrate 100 may be a glass substrate with $SiO_2$ as a main component.

According to some example embodiments, by disposing a first optical layer 241 having a refractive index of a value between the refractive index of a second optical layer 245 and the refractive index of the capping layer 230, between the capping layer 230 and the second optical layer 245 which have high refractive indices compared to the second optical layer 245, it is possible to minimize or prevent a phenomenon that the screen of the display device is seen as turning greenish at a high angle (e.g., θ=60° or more) in the MPCD of the display device 10.

Figure 11:
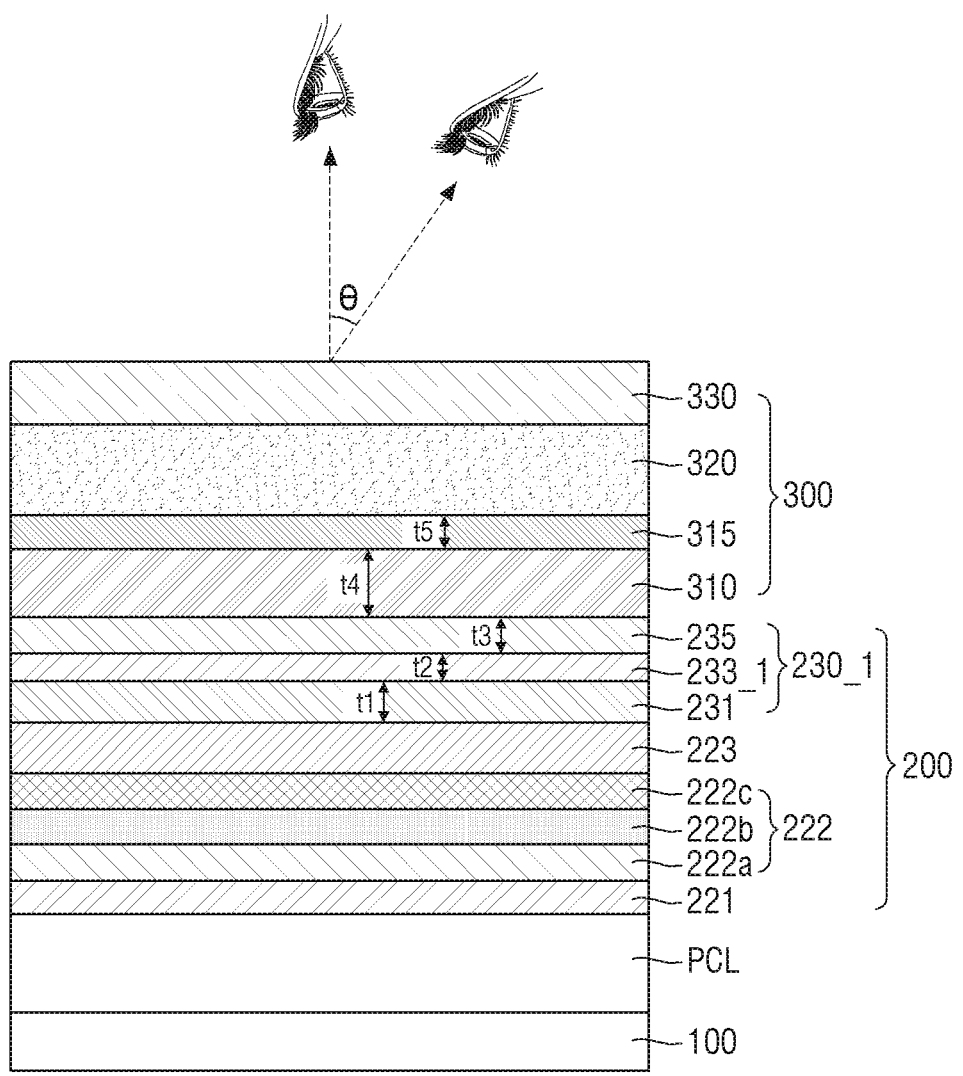
FIG. 11 is a schematic diagram schematically illustrating a display device according to some example embodiments.
Figure 12:
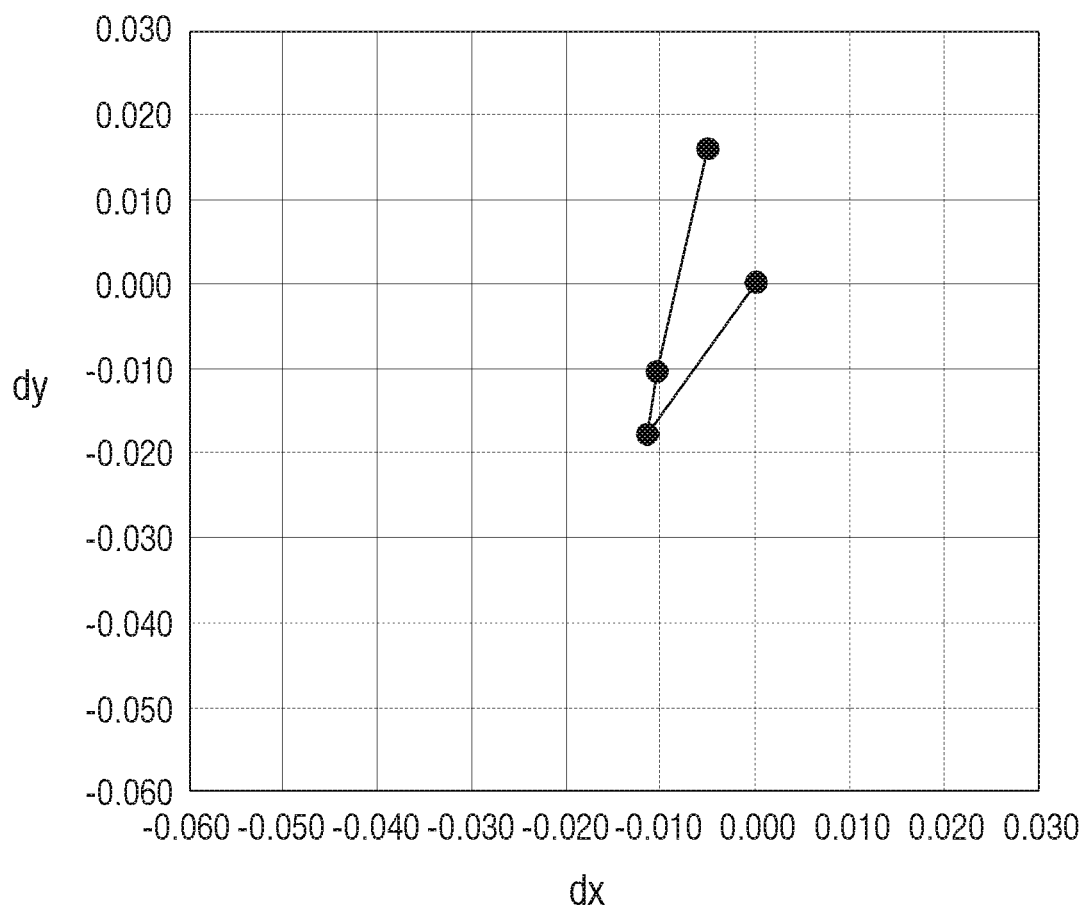
FIG. 12 is a diagram illustrating a minimum perceptible color difference (MPCD) when a second capping layer is applied according to some example embodiments.

FIG. 11 is a schematic diagram schematically illustrating a display device according to some example embodiments. FIG. 12 is a diagram illustrating a minimum perceptible color difference (MPCD) when a second capping layer is applied according to some example embodiments.

FIGS. 11 and 12, the second thickness t2 of a second capping layer 233_1 of a capping layer 230_1 of a display layer 200_1 according to some example embodiments may be selected within a range of about 45 nm to 55 nm, so that it differs from the second capping layer 233 of the capping layer 230 according to some example embodiments.

For example, the second thickness t2 of the second capping layer 233_1 of the capping layer 230_1 according to some example embodiments may be selected within a range of about 45 nm to 55 nm.

according to some example embodiments, as illustrated in FIG. 12, it can be seen that, compared to the embodiments illustrated with respect to FIG. 6, the overall amount of the color temperature direction in the MPCD of the display device is small. For example, according to the embodiments illustrated with respect to FIG. 6, as described above, the overall amount of change in the x-axis (dx) is about 0.038 and the overall amount of change in the y-axis (dy) is about 0.015, and according to the embodiments illustrated with respect to FIG. 12, the overall amount of change in the x-axis (dx) is about 0.011 and the overall amount of change in y-axis (dy) is about 0.018. In other words, according to some example embodiments as illustrated in FIG. 7, the amount of change in the y-axis is 0.003 larger compared to the embodiments described with respect to FIG. 6, but the amount of change in the x-axis is 0.027 smaller compared to the embodiments illustrated with respect to FIG. 6.

According to some example embodiments, because the refractive index of the second capping layer 233_1 is larger than the refractive index of the first capping layer 231 and the refractive index of the third capping layer 235, respectively and the second thickness t2 of the second capping layer 233_1 has a range of about 45 nm to about 55 nm, it is possible to prevent an increase in the overall amount of movement in the color temperature direction on the minimum perceptible color difference (MPCD) when viewed from the direction (e.g., the z direction) perpendicular to and a direction oblique to the substrate 100, due to the thin film interference phenomenon of the thin film encapsulation layer 300.

Figure 13:
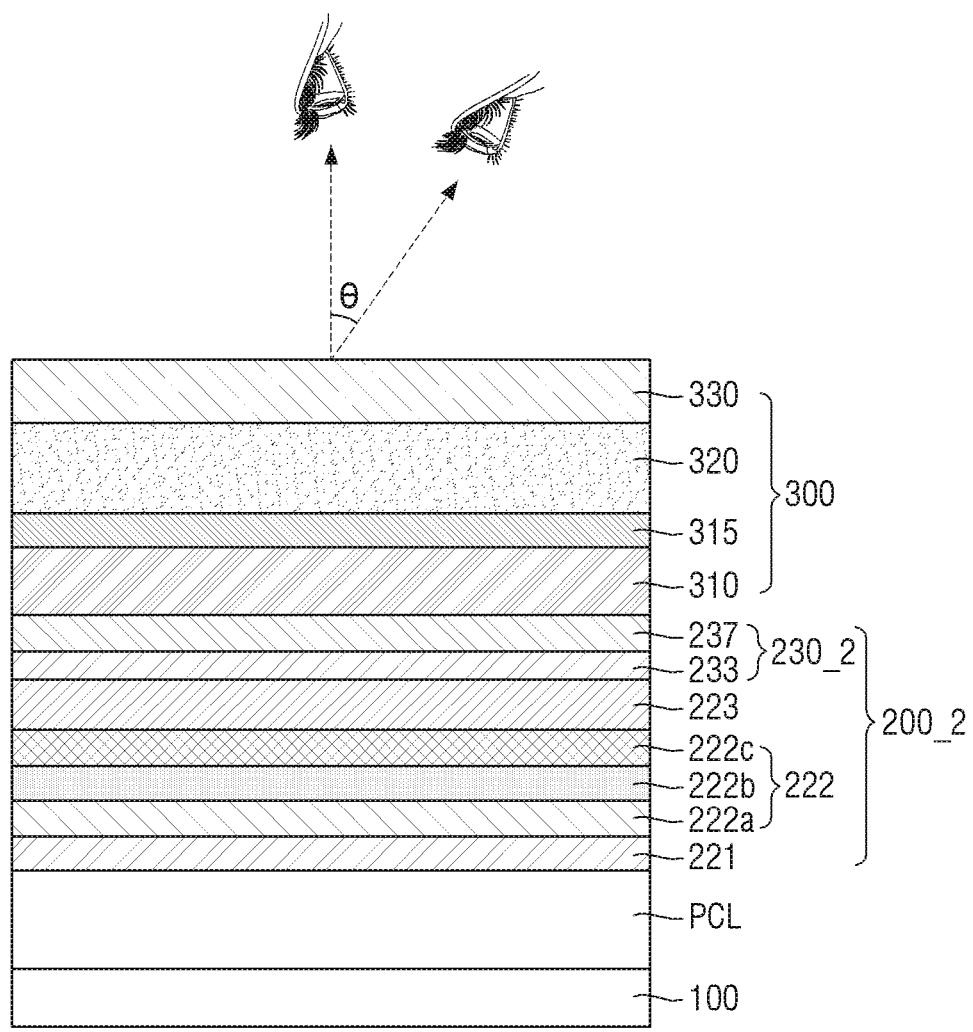
FIG. 13 is a cross-sectional view schematically illustrating a display device according to some example embodiments.
Figure 14:
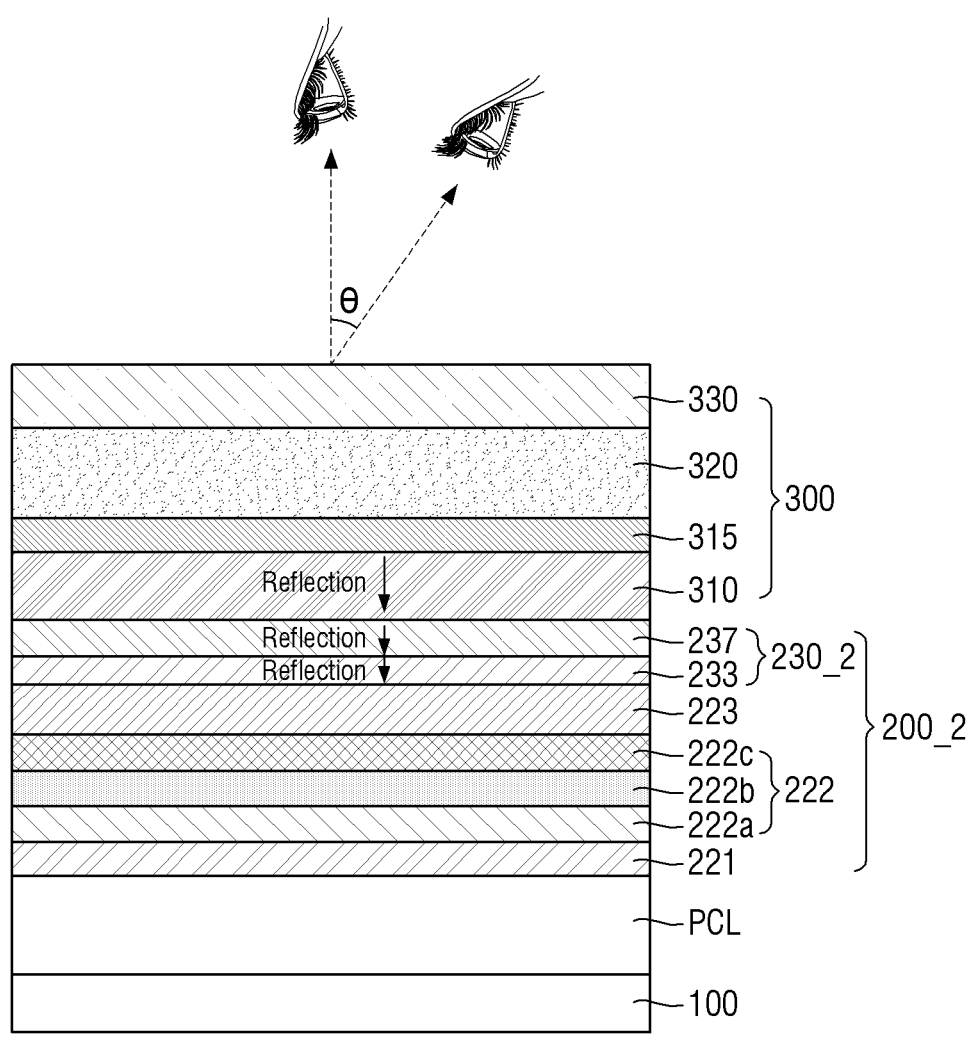
FIG. 14 is a schematic diagram schematically illustrating a display device according to some example embodiments.

FIG. 13 is a cross-sectional view schematically illustrating a display device according to some example embodiments. FIG. 14 is a schematic diagram schematically illustrating a display device according to some example embodiments.

Referring to FIGS. 13 and 14, the display device differs from the display device of FIG. 4 in that a capping layer 230_2 of a display layer 200_2 includes the second capping layer 233 described above with reference to FIG. 4, and a fourth capping layer 237 on the second capping layer 233.

For example, the capping layer 230_2 of the display layer 200_2 of the display device according to some example embodiments may include the second capping layer 233 described above with reference to FIG. 4, and a fourth capping layer 237 on the second capping layer 233.

The fourth capping layer 237 may be disposed between the second capping layer 233 and the first inorganic encapsulation layer 310, and the first inorganic encapsulation layer 310 may be disposed between the fourth capping layer 237 and the auxiliary layer 315.

The fourth capping layer 237 may be interposed between the second capping layer 233 and the first inorganic encapsulation layer 310, and the first inorganic encapsulation layer 310 may be interposed between the fourth capping layer 237 and the auxiliary layer 315.

The refractive index of the fourth capping layer 237 may be smaller than the refractive index of the second capping layer 233 and larger than the refractive index of the first inorganic encapsulation layer 310, respectively. In other words, the refractive index of the fourth capping layer 237 may have a value between the refractive index of the second capping layer 233 and the refractive index of the first inorganic encapsulation layer 310. Further, the refractive index of the first inorganic encapsulation layer 310 may be larger than the refractive index of the auxiliary layer 315. That is, the refractive index may decrease in the order of the second capping layer 233, the fourth capping layer 237, the first inorganic encapsulation layer 310, and the auxiliary layer 315.

For example, the refractive index of the second capping layer 233 and the refractive index of the fourth capping layer 237 may be about 1.77 or more, the refractive index of the first inorganic encapsulation layer 310 may be larger than 1.62 and equal to or less than 1.77, and the refractive index of the auxiliary layer 315 may be equal to or less than 1.62.

For example, the refractive index of the second capping layer 233 may be about 1.972, the refractive index of the fourth capping layer 237 may be about 1.87, the refractive index of the first inorganic encapsulation layer 310 may be about 1.77, and the refractive index of the auxiliary layer 315 may be about 1.62.

Conventionally, when light travels from a medium having a large refractive index to a medium having a relatively small refractive index, total reflection may occur at the interface. In addition, when the difference in refractive indices between adjacent media is large with respect to the interface, the degree of total reflection may be increased.

When the light emitted from the display element moves upward, and the degree of total reflection between adjacent media at the interface between the second capping layer 233 and the fourth capping layer 237 and at the interface between the fourth capping layer 237 and the first inorganic encapsulation layer 310 increases, a variation in the color coordinates may be large.

However, according to some example embodiments, the refractive index decreases in the order of the second capping layer 233, the fourth capping layer 237, the first inorganic encapsulation layer 310, and the auxiliary layer 315, and the fourth capping layer 237 having a refractive index value between the second capping layer 233 and the first inorganic encapsulation layer 310 is further disposed in order to reduce a large refractive index difference between the capping layer 233 and the first inorganic encapsulation layer 310. Thus, it is possible to further reduce the degree of total reflection at the interface between the second capping layer 233 and the fourth capping layer 237 and at the interface between the fourth capping layer 237 and the first inorganic encapsulation layer 310. As a result, it is possible to prevent in advance a variation in the color coordinates from becoming large when the light emitted from the display element moves upward, and the degree of total reflection between adjacent media at the interface between the second capping layer 233 and the fourth capping layer 237 and at the interface between the fourth capping layer 237 and the first inorganic encapsulation layer 310 increases.

Figure 15:
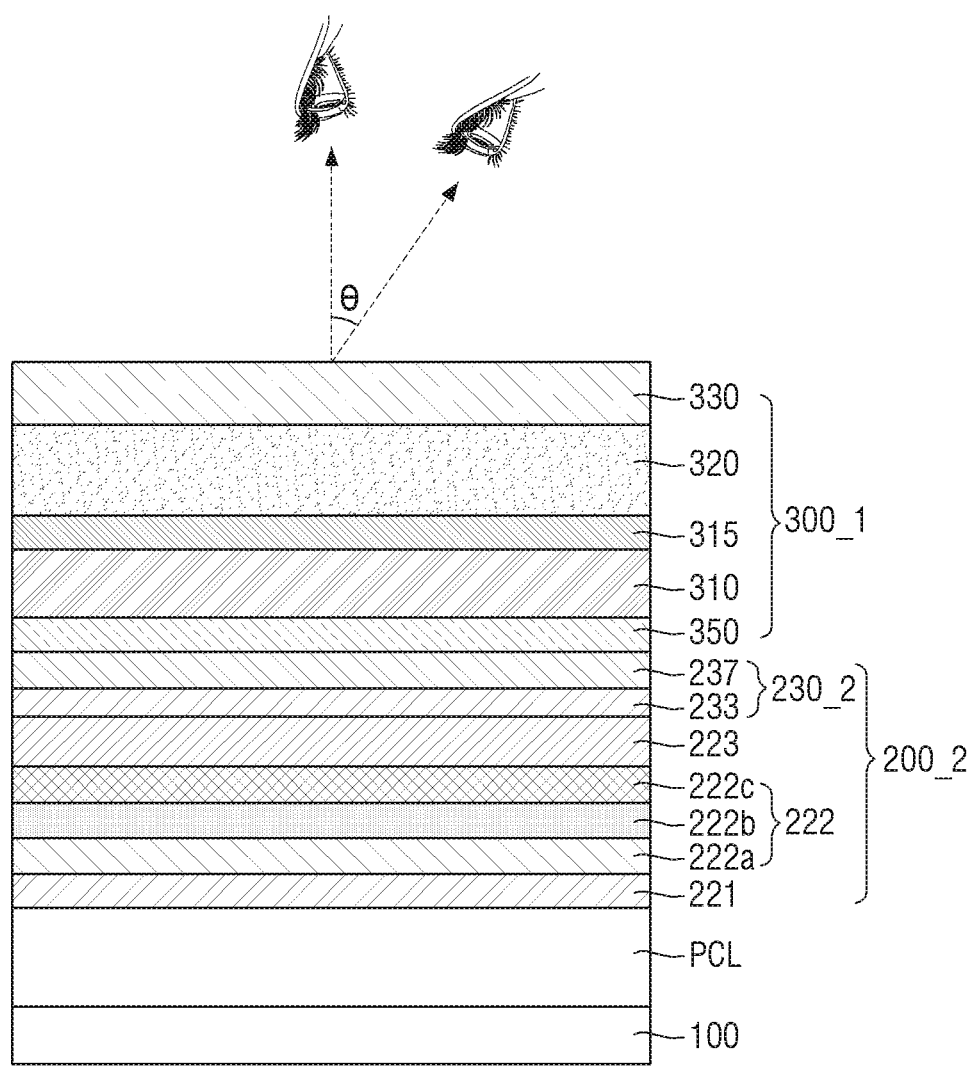
FIG. 15 is a cross-sectional view schematically illustrating a display device according to some embodiments.
Figure 16:
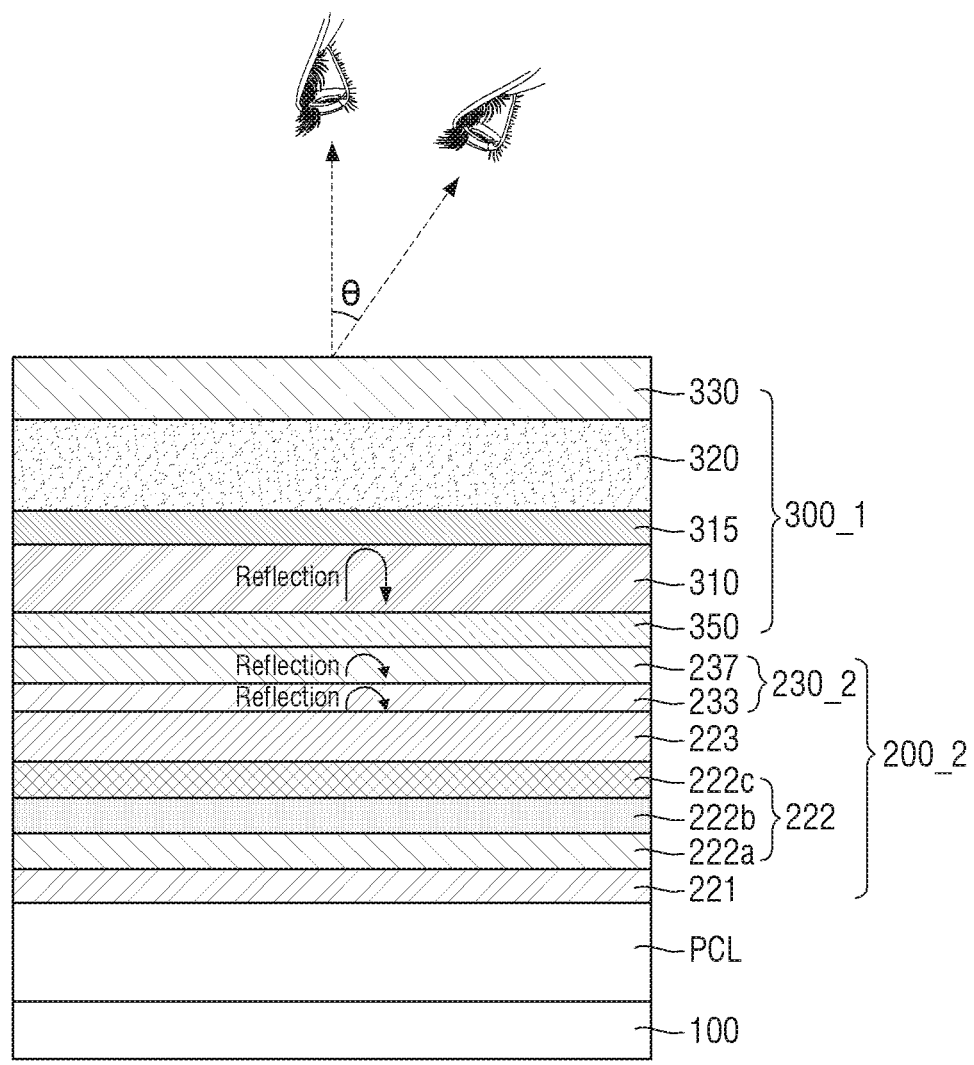
FIG. 16 is a schematic diagram schematically illustrating a display device according to some embodiments.

FIG. 15 is a cross-sectional view schematically illustrating a display device according to some embodiments. FIG. 16 is a schematic diagram schematically illustrating a display device according some embodiments.

Referring to FIGS. 15 and 16, a thin film encapsulation layer 300_1 of the display device according to some embodiments of the present embodiment is different from the thin film encapsulation layer 300 of the display device described with respect to FIG. 13 in that it may further include at least one auxiliary layer under the first inorganic encapsulation layer 310.

For example, the thin film encapsulation layer 300_1 as illustrated in FIGS. 15 and 16 may further include a lower auxiliary layer 350 located under the first inorganic encapsulation layer 310. That is, the thin film encapsulation layer 300_1 according to some embodiments may include the lower auxiliary layer 350, the first inorganic encapsulation layer 310, the auxiliary layer 315, the organic encapsulation layer 320, and the second inorganic encapsulation layer 330.

The lower auxiliary layer 350 may be located between the first inorganic encapsulation layer 310 and the fourth capping layer 237.

The lower auxiliary layer 350 may be interposed between the first inorganic encapsulation layer 310 and the fourth capping layer 237.

The refractive index of the lower auxiliary layer 350 may be smaller than the refractive index of the first inorganic encapsulation layer 310. The refractive index of the lower auxiliary layer 350 may be smaller than the refractive index of the fourth capping layer 237. That is, the refractive index of the lower auxiliary layer 350 may be smaller than each of the refractive index of the first inorganic encapsulation layer 310 and the refractive index of the fourth capping layer 237.

As described above, the refractive index of the first inorganic encapsulation layer 310 may be greater than 1.62 and equal to or less than 1.77, and the refractive index of the fourth capping layer 237 may be equal to or greater than about 1.77. A difference between the refractive index of the lower auxiliary layer 350 and the refractive index of the fourth capping layer 237 may be greater than a difference between the refractive index of the lower auxiliary layer 350 and the refractive index of the first inorganic encapsulation layer 310. According to some embodiments, the refractive index of the lower auxiliary layer 350 may be equal to or greater than 1.4 and less than 1.62. For example, the refractive index of the lower auxiliary layer 350 may be about 1.57.

As described above with reference to FIG. 13, when light travels from a medium having a large refractive index to a medium having a relatively small refractive index, total reflection may occur at the interface. In addition, when the difference in refractive index between adjacent media is large with respect to the interface, the degree of total reflection may be increased.

That is, as the light emitted from the display element moves upward, when the degree of total reflection between adjacent media at the interface between the fourth capping layer 237 and the first inorganic encapsulation layer 310 increases, a variation in the color coordinates may be large.

However, according to some embodiments, the lower auxiliary layer 350 having a refractive index value between the fourth capping layer 237 and the first inorganic encapsulation layer 310 may further be arranged in order to reduce a large difference in refractive index between the fourth capping layer 237 and the first inorganic encapsulation layer 310. Thus, it may be possible to further reduce the degree of total reflection at the interface between the fourth capping layer 237 and the first inorganic encapsulation layer 310. As a result, it may be possible to prevent or reduce instances of a phenomenon in which a variation in the color coordinates becomes large when the light emitted from the display element moves upward, and the degree of total reflection between adjacent media at the interface between the fourth capping layer 237 and the first inorganic encapsulation layer 310 increases.

As described above, aspects of some embodiments according to the present disclosure have been described with reference to some example embodiments illustrated in the drawings, but those skilled in the art will understand that various modifications and modifications of the embodiments are possible therefrom. Accordingly, the true technical protection scope of the present disclosure should be determined by the technical spirit of the appended claims and their equivalents.

What is claimed is:

1. A display device comprising:
a substrate;
a display element on the substrate;
a capping layer on the display element; and
a thin film encapsulation layer on the capping layer,
wherein the capping layer includes:
a first capping layer on the display element;
a second capping layer on the first capping layer, the second capping layer having a refractive index greater than that of the first capping layer; and
a third capping layer on the second capping layer, such that the second capping layer is between the first capping layer and the third capping layer, the third capping layer having a refractive index smaller than that of the second capping layer,
wherein the second capping layer has a thickness of 30 nanometers (nm) to 60 nm, and
wherein the thin film encapsulation layer includes a first inorganic encapsulation layer, an auxiliary layer on the first inorganic encapsulation layer, and an organic encapsulation layer on the auxiliary layer.

2. The display device of claim 1, wherein the second capping layer has a thickness of 30 nm to 40 nm.

3. The display device of claim 2, wherein the first capping layer has a thickness of 30 nm to 40 nm, and the third capping layer has a thickness of 35 nm to 45 nm.

4. The display device of claim 3, wherein the second capping layer has a refractive index in a range of 1.61 to 2.3, and
each of the first capping layer and the third capping layer has a refractive index in a range of 1.45 to 1.6.

5. The display device of claim 2, wherein the first inorganic encapsulation layer is on the third capping layer, and the thin film encapsulation layer further includes a second inorganic encapsulation layer on the organic encapsulation layer.

6. The display device of claim 5, wherein the auxiliary layer has a thickness of 30 nm to 100 nm, and
the first inorganic encapsulation layer has a thickness of 400 nm to 2200 nm.

7. The display device of claim 6, wherein the auxiliary layer is interposed between the first inorganic encapsulation layer and the organic encapsulation layer,
the first inorganic encapsulation layer has a refractive index greater than that of the auxiliary layer, and
the auxiliary layer has a refractive index between those of the first inorganic encapsulation layer and the organic encapsulation layer.

8. The display device of claim 7, wherein a refractive index (n3) of the auxiliary layer satisfies the following condition:

$$\min(n1,n2)+|n2-n1|\times 0.25 < n3 < \min(n1,n2)+|n2-n1|\times 0.75$$

where n1 represents a refractive index of the first inorganic encapsulation layer, n2 represents a refractive index of the organic encapsulation layer, min(n1, n2) represents a minimum value of n1 and n2, and |n2−n1| represents an absolute value of a difference between n2 and n1.

9. The display device of claim 5, wherein each of the first inorganic encapsulation layer and the auxiliary layer includes an inorganic insulating material.

10. The display device of claim 5, further comprising:
a lower layer interposed between the auxiliary layer and the organic encapsulation layer.

11. The display device of claim 10, wherein the auxiliary layer has a refractive index greater than that of the organic encapsulation layer, and
the lower layer has a refractive index between those of the auxiliary layer and the organic encapsulation layer.

12. The display device of claim 11, wherein a refractive index (n3) of the auxiliary layer satisfies the following condition:

$$\min(n1,n2)+|n2-n1|\times 0.25 < n3 < \min(n1,n2)+|n2-n1|\times 0.75$$

where n1 represents a refractive index of the first inorganic encapsulation layer, n2 represents a refractive index of the lower layer, min(n1, n2) represents a minimum value of n1 and n2, and |n2−n1| represents an absolute value of a difference between n2 and n1.

13. The display device of claim 11, wherein a difference between the refractive index of the lower layer and the refractive index of the organic encapsulation layer is smaller than 0.05, and
the lower layer includes an inorganic insulating material.

14. The display device of claim 13, wherein the lower layer and the auxiliary layer include an inorganic insulating material containing a silicon element, a nitrogen element, and an oxygen element, and
an oxygen content of the lower layer is greater than an oxygen content of the auxiliary layer.

15. The display device of claim 5, wherein the first inorganic encapsulation layer includes a plurality of stacked films.

16. The display device of claim 1, wherein
the second capping layer has a thickness of 45 nm to 55 nm.

17. A display device comprising:
a substrate;
organic light emitting diodes on the substrate;
a capping layer on the organic light emitting diodes; and
a thin film encapsulation layer on the capping layer,
wherein the capping layer includes:
a first capping layer on the organic light emitting diodes;
a second capping layer on the first capping layer, the second capping layer having a refractive index greater than that of the first capping layer; and
a third capping layer on the second capping layer, such that the second capping layer is between the first capping layer and the third capping layer, the third capping layer having a refractive index smaller than that of the second capping layer,
wherein the second capping layer has a refractive index in a range of 1.61 to 2.3, and each of the first capping layer and the third capping layer has a refractive index in a range of 1.45 to 1.6,
wherein the second capping layer has a thickness of 30 nanometers (nm) to 60 nm, and
wherein the thin film encapsulation layer includes a first inorganic encapsulation layer, an auxiliary layer on the first inorganic encapsulation layer, and an organic encapsulation layer on the auxiliary layer.

18. The display device of claim 17, wherein the second capping layer is interposed between the first capping layer and the third capping layer, and
the second capping layer has a thickness of 30 nm to 40 nm.

19. The display device of claim 18, wherein the first capping layer has a thickness of 30 nm to 40 nm, and
the third capping layer has a thickness of 35 nm to 45 nm.

20. The display device of claim 17, wherein the second capping layer is interposed between the first capping layer and the third capping layer,
the second capping layer has a thickness of 45 nm to 55 nm, and
the first capping layer has a thickness of 30 nm to 40 nm, and the third capping layer has a thickness of 35 nm to 45 nm.

21. A display device comprising:
a substrate;
a display element on the substrate;
a capping layer on the display element; and
a thin film encapsulation layer on the capping layer,
wherein the capping layer includes:
a first capping layer on the display element; and
a second capping layer between the first capping layer and the thin film encapsulation layer, and
the second capping layer has a refractive index smaller than that of the first capping layer and larger than that of the thin film encapsulation layer,
wherein the thin film encapsulation layer includes a first inorganic encapsulation layer, and an auxiliary layer on the first inorganic encapsulation layer,
the first inorganic encapsulation layer is interposed between the auxiliary layer and the second capping layer,
the second capping layer has a refractive index greater than that of the first inorganic encapsulation layer, and
the first inorganic encapsulation layer has a refractive index greater than that of the auxiliary layer.

22. The display device of claim 21, wherein the capping layer has a refractive index equal to or greater than 1.77, and
the first inorganic encapsulation layer has a refractive index smaller than 1.77.

23. The display device of claim 21, wherein the thin film encapsulation layer further includes a lower auxiliary layer between the second capping layer and the first inorganic encapsulation layer, and the lower auxiliary layer has a refractive index between those of the second capping layer and the first inorganic encapsulation layer.

24. The display device of claim 23, wherein the lower auxiliary layer is between the second capping layer and the first inorganic encapsulation layer.

25. The display device of claim 24, wherein a difference in refractive index between the lower auxiliary layer and the second capping layer is greater than a difference in refractive index between the lower auxiliary layer and the first inorganic encapsulation layer.

26. The display device of claim 25, wherein the refractive index of the lower auxiliary layer has a value equal to or greater than 1.4 and less than 1.62.

* * * * *